(12) United States Patent
Tsumita et al.

(10) Patent No.: US 11,974,507 B2
(45) Date of Patent: Apr. 30, 2024

(54) STORAGE ELEMENT, SEMICONDUCTOR DEVICE, MAGNETIC RECORDING ARRAY, AND METHOD OF MANUFACTURING STORAGE ELEMENT

(71) Applicant: TDK CORPORATION, Tokyo (JP)

(72) Inventors: Atsushi Tsumita, Tokyo (JP); Yohei Shiokawa, Tokyo (JP)

(73) Assignee: TDK CORPORATION, Tokyo (JP)

( * ) Notice: Subject to any disclaimer, the term of this patent is extended or adjusted under 35 U.S.C. 154(b) by 442 days.

(21) Appl. No.: 17/288,612

(22) PCT Filed: Mar. 28, 2019

(86) PCT No.: PCT/JP2019/013592
§ 371 (c)(1),
(2) Date: Apr. 26, 2021

(87) PCT Pub. No.: WO2020/194660
PCT Pub. Date: Oct. 1, 2020

(65) Prior Publication Data
US 2021/0399211 A1 Dec. 23, 2021

(51) Int. Cl.
*H10N 52/80* (2023.01)
*G11C 11/16* (2006.01)
(Continued)

(52) U.S. Cl.
CPC ............. *H10N 52/80* (2023.02); *H10N 52/01* (2023.02); *G11C 11/161* (2013.01); *H10B 61/22* (2023.02); *H10N 50/10* (2023.02)

(58) Field of Classification Search
None
See application file for complete search history.

(56) References Cited

U.S. PATENT DOCUMENTS 8,350,347 B2  1/2013  Gaudin et al.
8,928,100 B2*  1/2015  Gaidis ................. H01F 10/3254
                                              257/422
(Continued)

FOREIGN PATENT DOCUMENTS

CN        108292702 A     7/2018
JP        H11-112052 A    4/1999
(Continued)

OTHER PUBLICATIONS

Jun. 11, 2019 International Search Report issued in International Patent Application No. PCT/JP2019/013592.
(Continued)

*Primary Examiner* — Bo B Jang
(74) *Attorney, Agent, or Firm* — Oliff PLC

(57) ABSTRACT

A storage element includes a first ferromagnetic layer; a second ferromagnetic layer; a nonmagnetic layer interposed between the first ferromagnetic layer and the second ferromagnetic layer in a first direction; a first wiring that extends in a second direction different from the first direction and together with the nonmagnetic layer sandwiches the first ferromagnetic layer in the first direction; and an electrode that together with the nonmagnetic layer sandwiches the second ferromagnetic layer in at least a part in the first direction, wherein the electrode is in contact with at least a part of a lateral side surface of the second ferromagnetic layer.

10 Claims, 18 Drawing Sheets

(51) Int. Cl.
  *H10N 50/10* (2023.01)
  *H10N 52/01* (2023.01)
  *H10B 61/00* (2023.01)

(56) References Cited

U.S. PATENT DOCUMENTS

| 10,355,198 B2* | 7/2019 | Liao ............... H10N 50/10 |
| 2010/0003767 A1 | 1/2010 | Cho |
| 2015/0348606 A1 | 12/2015 | Buhrman et al. |
| 2017/0222135 A1 | 8/2017 | Fukami et al. |
| 2018/0337326 A1 | 11/2018 | Sasaki |
| 2019/0319183 A1 | 10/2019 | Sasaki et al. |

FOREIGN PATENT DOCUMENTS

| JP | 2010-016384 A | 1/2010 |
| JP | 2012-142418 A | 7/2012 |
| JP | 2017-216286 A | 12/2017 |
| WO | 2016/021468 A1 | 2/2016 |
| WO | 2019/049591 A1 | 3/2019 |

OTHER PUBLICATIONS

Y.K. Kato et al. "Observation of the Spin Hall Effect in Semiconductors". Science, vol. 306, Dec. 10, 2004, pp. 1910-1913.
Ioan Mihai Miron et al. "Perpendicular Switching of a Single Ferromagnetic Layer Induced by In-Plane Current Injection". Nature, vol. 476, Aug. 11, 2011, pp. 189-194.
Luqiao Liu et al. "Spin Torque Switching With the Giant Spin Hall Effect of Tantalum". Science, vol. 336, 2012, pp. 555.
Luqiao Liu et al. "Current-Induced Switching of Perpendicularly Magnetized Magnetic Layers Using Spin Torque From the Spin Hall Effect". Physical Review Letters, vol. 109, 2012, pp. 096602.
Ki-Seung Lee et al. "Threshold Current for Switching of a Perpendicular Magnetic Layer Induced by Spin Hall Effect". Applied Physics Letters, vol. 102, 2013, pp. 112410.
Ki-Seung Lee et al. "Thermally Activated Switching of Perpendicular Magnet by Spin-Orbit Spin Torque". Applied Physics Letters, vol. 104, 2014, pp. 072413.
Shunsuke Fukami et al. "Magnetization Switching by Spin-Orbit Torque in an Antiferromagnet-Ferromagnet Bilayer System". Nature Materials, vol. 15, May 2016, pp. 535-542.
S. Fukami et al. "A Spin-Orbit Torque Switching Scheme With Collinear Magnetic Easy Axis and Current Configuration". Nature Nanotechnology, 2016, pp. 1-6.
S. Takahashi et al. "Spin Injection and Detection in Magnetic Nanostructures". Physical Review B, vol. 67, 2003, pp. 052409.
Yeongkyo Seo et al. "Area-Efficient Sot-Mram With a Schottky Diode". IEEE Electron Device Letters, vol. 37, No. 8, Aug. 2016, pp. 982-985.
Wei Zhang et al. "Spin Hall Effects in Metallic Antiferromagnets". Physical Review Letters, vol. 113, 2014, pp. 196602.

* cited by examiner

STORAGE ELEMENT, SEMICONDUCTOR DEVICE, MAGNETIC RECORDING ARRAY, AND METHOD OF MANUFACTURING STORAGE ELEMENT

TECHNICAL FIELD

The present invention relates to a storage element, a semiconductor device, a magnetic recording array, and a method of manufacturing a storage element.

BACKGROUND ART

A giant magnetoresistance (GMR) element constituted by a multilayer film of a ferromagnetic layer and a nonmagnetic layer and a tunnel magnetoresistance (TMR) element using an insulating layer (a tunnel barrier layer or a barrier layer) as a nonmagnetic layer are known as a magnetoresistance effect element. A magnetoresistance effect element can be applied to a magnetic sensor, a radio frequency component, a magnetic head, and a magnetic random access memory (MRAM).

An MRAM is a storage element in which magnetoresistance effect elements are integrated. An MRAM reads and writes data using a characteristic that a resistance of the magnetoresistance effect element changes when mutual magnetization directions of two ferromagnetic layers with the nonmagnetic layer interposed therebetween in the magnetoresistance effect element change. The magnetization directions of the ferromagnetic layers are controlled using, for example, a magnetic field generated by a current. Further, for example, the magnetization directions of the ferromagnetic layers are controlled using a spin transfer torque (STT) generated by passing a current in a stacking direction of the magnetoresistance effect elements.

In a case in which the magnetization directions of the ferromagnetic layers are rewritten using the STT, the current is passed in the stacking direction of the magnetoresistance effect elements. A write current causes deterioration of the characteristics of the magnetoresistance effect element.

In recent years, attention has been focused on a method in which a current does not have to be passed in the stacking direction of the magnetoresistance effect elements during writing. One such method is a writing method using a spin-orbit torque (SOT) (for example, Patent Literature 1). An SOT is induced by a spin current generated by a spin-orbit interaction or a Rashba effect at an interface between different materials. A current for inducing an SOT in the magnetoresistance effect element flows in a direction intersecting the stacking direction of the magnetoresistance effect elements. That is, it is not necessary to pass a current in the stacking direction of the magnetoresistance effect element, and it is expected that the life-span of the magnetoresistance effect element will be extended.

CITATION LIST

Patent Literature

[Patent Literature 1]
Japanese Unexamined Patent Application, First Publication No. 2017-216286

SUMMARY OF INVENTION

Technical Problem

A resistance value of a magnetoresistance effect element in the stacking direction changes due to a difference in the relative angle of a magnetization orientation direction between the two ferromagnetic layers with the nonmagnetic layer interposed therebetween. The storage element stores a difference in resistance value of the magnetoresistance effect element as data. The data is read by passing a read current in the stacking direction of the magnetoresistance effect elements. Magnetoresistance effect elements are often integrated and used as a magnetic memory. As the amount of the read current applied to each magnetoresistance effect element increases, the power consumption of the magnetic memory increases.

The present invention has been made in view of the above circumstances, and provides a storage element, a semiconductor device, and a magnetic recording array that can secure a read path for a current and operate with low power consumption.

Solution to Problem

The present invention provides the following means for solving the above problems.

(1) A storage element according to a first aspect includes a first ferromagnetic layer; a second ferromagnetic layer; a nonmagnetic layer interposed between the first ferromagnetic layer and the second ferromagnetic layer in a first direction; a first wiring that extends in a second direction different from the first direction and together with the nonmagnetic layer sandwiches the first ferromagnetic layer in the first direction; and an electrode that together with the nonmagnetic layer sandwiches the second ferromagnetic layer in at least a part in the first direction, wherein the electrode is in contact with at least a part of a lateral side surface of the second ferromagnetic layer.

(2) In the storage element according to the above aspect, the electrode may have a first section covering a first surface of the second ferromagnetic layer opposite to the nonmagnetic layer and a second section covering the first section and extending in a second direction, the second section may be in contact with at least a part of the lateral side surface of the second ferromagnetic layer, and the second section may have a lower resistance than the first section.

(3) In the storage element according to the above aspect, the electrode may have a third section in contact with the second section, and a compound layer may be provided between the second section and the third section.

(4) In the storage element according to the above aspect, a portion where a distance between the first wiring and the electrode in the first direction varies may be provided.

(5) The storage element according to the above aspect may further include a first conductive portion and a second conductive portion which are connected to the first wiring at positions where the first ferromagnetic layer is interposed therebetween in the second direction, wherein a first distance between the first wiring and the electrode at a midpoint between a first end of the first ferromagnetic layer on a side of the first conductive portion and a second end of the first conductive portion on a side of the first ferromagnetic layer in the second direction may be shorter than a second distance between the first wiring and the electrode at a position further away from the first ferromagnetic layer than the midpoint.

(6) The storage element according to the above aspect may further include a first conductive portion and a second conductive portion which are connected to the first wiring at positions where the first ferromagnetic layer is interposed therebetween in the second direction, wherein a first distance between the first wiring and the electrode at a midpoint between a first end of the first ferromagnetic layer on a side of the first conductive portion and a second end of the first conductive portion on a side of the first ferromagnetic layer in the second direction may be shorter than a third distance between the first wiring and the electrode at an intersection between the electrode and the second ferromagnetic layer or the nonmagnetic layer.

(7) In the storage element according to the above aspect, a surface of the electrode on a side of the first wiring may have an inclined surface that is inclined with respect to a first plane orthogonal to the first direction, and an inclination of a tangent plane at a first point of the inclined surface with respect to the first plane may be larger than an inclination of a tangent plane at a second point located on the second ferromagnetic layer side from the first point with respect to the first plane.

(8) In the storage element according to the above aspect, the first wiring may contain any one of a metal, an alloy, an intermetallic compound, a metal boride, a metal carbide, a metal silicide, and a metal phosphide which have a function of generating a spin current due to a spin Hall effect when a current flows.

(9) A semiconductor device according to a second aspect includes the storage element according to the above aspect; and a plurality of switching elements electrically connected to the storage element.

(10) A magnetic recording array according to a third aspect has a plurality of the storage elements according to the above aspect.

(11) A method of manufacturing a storage element according to a fourth aspect includes a step of stacking a conductive layer, a first magnetic layer, a nonmagnetic layer, and a second magnetic layer in this order; a step of processing the first magnetic layer, the nonmagnetic layer, and the second magnetic layer into a predetermined shape to form a magnetoresistance effect element in which a first ferromagnetic layer, a nonmagnetic layer, and a second ferromagnetic layer are stacked in this order; a step of coating a periphery of the magnetoresistance effect element with an insulating layer such that a lateral side surface of the second ferromagnetic layer is exposed; and a step of forming an electrode on one surface of each of the magnetoresistance effect element and the insulating layer.

Advantageous Effects of Invention

The storage element, the semiconductor device, and the magnetic recording array according to the present embodiment can secure a read path for a current and operate with low power consumption.

DESCRIPTION OF EMBODIMENTS

Figure 1:
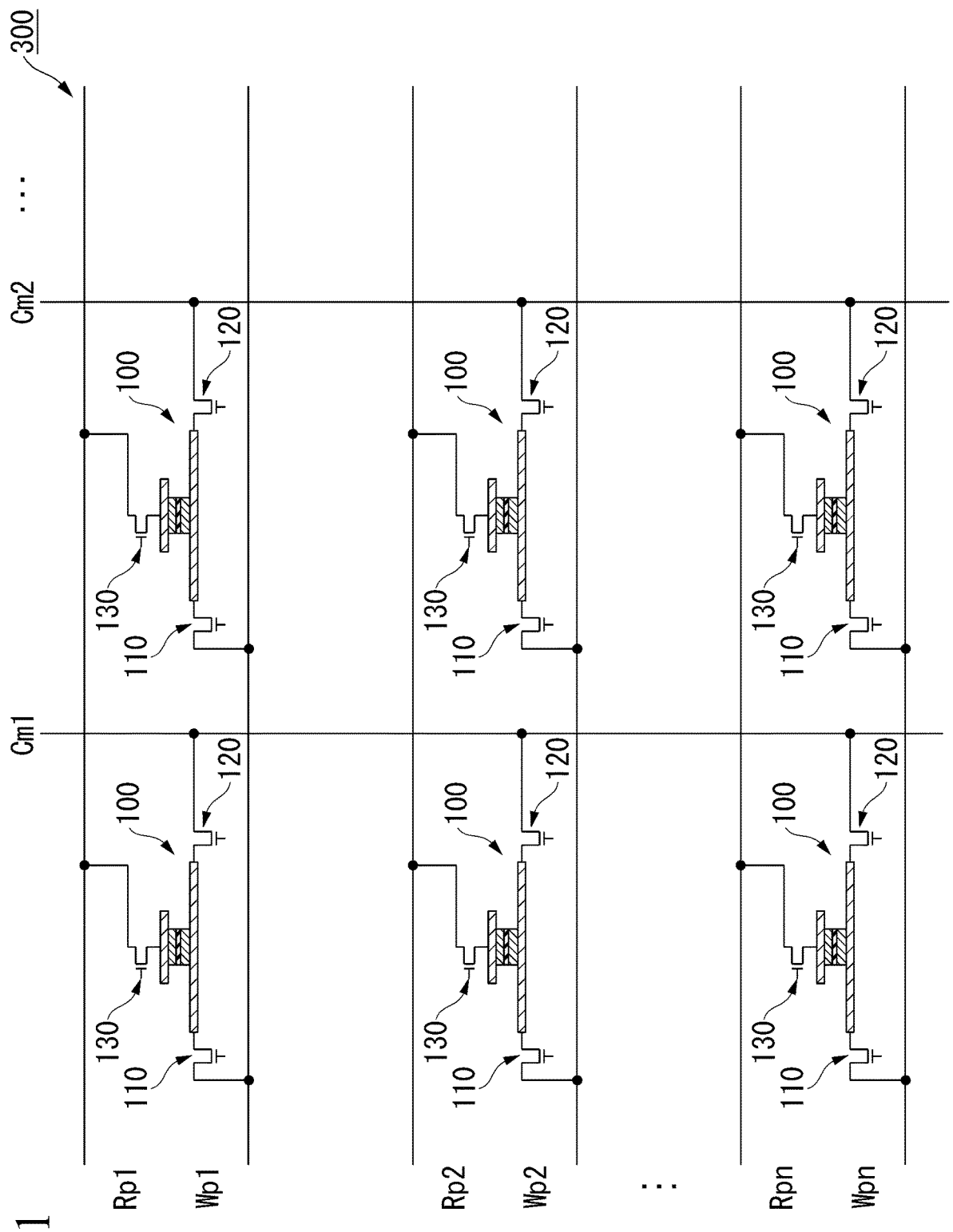
FIG. 1 is a schematic view of a magnetic recording array according to a first embodiment.

Hereinafter, the present embodiment will be described in detail with appropriate reference to the drawings. In the drawings used in the following description, a feature portion may be enlarged for convenience to make a feature easier to understand, and dimensional ratios of each constituent element and the like may be different from the actual ones. Materials, dimensions, and the like exemplified in the following description are examples, and the present invention is not limited thereto and can be appropriately modified and carried out within a scope in which the effects of the present invention are exhibited.

First, directions will be defined. A +x direction, a −x direction, a +y direction, and a −y direction are directions substantially parallel to one surface of a substrate Sub (see FIG. 2) that will be described later. The +x direction is one direction in which a first wiring 20 that will be described later extends and is a direction from a first switching element 110 that will be described later toward a second switching element 120 that will be described later. The −x direction is a direction opposite to the +x direction. In a case in which the +x direction and the −x direction are not distinguished from each other, an "x direction" is simply referred to. The x direction is an example of a second direction. The +y direction is one direction orthogonal to the x direction. The −y direction is a direction opposite to the +y direction. In a case in which the +y direction and the −y direction are not distinguished from each other, a "y direction" is simply referred to. A +z direction is a direction in which layers of a magnetoresistance effect element 10 that will be described later are stacked. The −z direction is a direction opposite to the +z direction. In a case in which the +z direction and the −z direction are not distinguished from each other, a "z direction" is simply referred to. The z direction is an example of a first direction. Hereinafter, the +z direction may be expressed as an "upward direction" and the −z direction may be expressed as a "downward direction." The upward and downward directions do not always coincide with the direction in which gravity acts.

In this description, the term "extending in the x direction" means that, for example, the dimension in the x direction is larger than the smallest dimension among the dimensions in the x direction, the y direction, and the z direction. The same applies to cases of extending in other directions. In this description, the term "connection" is not limited to a case of being physically connected, but also includes a case of being electrically connected. In this description, the term "facing" is not limited to a case in which two members are in contact with each other, but also includes a case in which another member exists between the two members.

First Embodiment

FIG. 1 is a configuration view of a magnetic recording array 300 according to a first embodiment. The magnetic recording array 300 includes a plurality of storage elements 100, a plurality of write wirings Wp1 to Wpn, and a plurality of common wirings Cm1 to Cmn, a plurality of read wirings Rp1 to Rpn, a plurality of first switching elements 110, a plurality of second switching elements 120, and a plurality of third switching elements 130. The magnetic recording array 300 can be used for, for example, a magnetic memory.

Each of the write wirings Wp1 to Wpn electrically connects a power supply to one or more storage elements 100. Each of the common wirings Cm1 to Cmn is a wiring used both when writing data and when reading data. Each of the common wirings Cm1 to Cmn electrically connects a reference potential to one or more storage elements 100. The reference potential is, for example, the ground. Each of the common wirings Cm1 to Cmn may be provided in each of the plurality of storage elements 100 or may be provided over the plurality of storage elements 100. Each of the read wirings Rp1 to Rpn electrically connects the power supply to one or more storage elements 100. The power supply is connected to the magnetic recording array 300 when used.

The first switching element 110, the second switching element 120, and the third switching element 130 shown in FIG. 1 are connected to each of the plurality of storage elements 100. The first switching element 110 is connected between each of the storage elements 100 and each of the write wirings Wp1 to Wpn. The second switching element 120 is connected between each of the storage elements 100 and each of the common wirings Cm1 to Cmn. The third switching element 130 is connected between each of the storage elements 100 and each of the read wirings Rp1 to Rpn.

When the first switching element 110 and the second switching element 120 are turned on, a write current flows between each of the write wirings Wp1 to Wpn and each of the common wirings Cm1 to Cmn which are connected to a predetermined storage element 100. When the second switching element 120 and the third switching element 130 are turned on, a read current flows between each of the common wirings Cm1 to Cmn and each of the read wirings Rp1 to Rpn which are connected to a predetermined storage element 100.

Each of the first switching element 110, the second switching element 120, and the third switching element 130 is an element that controls the flow of the current. Each of the first switching element 110, the second switching element 120, and the third switching element 130 is, for example, a transistor, an element using a phase change of a crystal layer such as an ovonic threshold switch (OTS), an element using a change in band structure such as a metal insulator transition (MIT) switch, an element using a breakdown voltage such as a Zener diode and an avalanche diode, or an element of which conductivity changes as an atomic position changes.

Any one of the first switching element 110, the second switching element 120, and the third switching element 130 may be shared between the storage elements 100 connected to the same wiring. For example, in a case in which the first switching element 110 is shared, one first switching element 110 is provided upstream of each of the write wirings Wp1 to Wpn. For example, in a case in which the second switching element 120 is shared, one second switching element 120 is provided upstream of each of the common wirings Cm1 to Cmn. For example, in a case in which the third switching element 130 is shared, one third switching element 130 is provided upstream of each of the read wirings Rp1 to Rpn.

Figure 2:
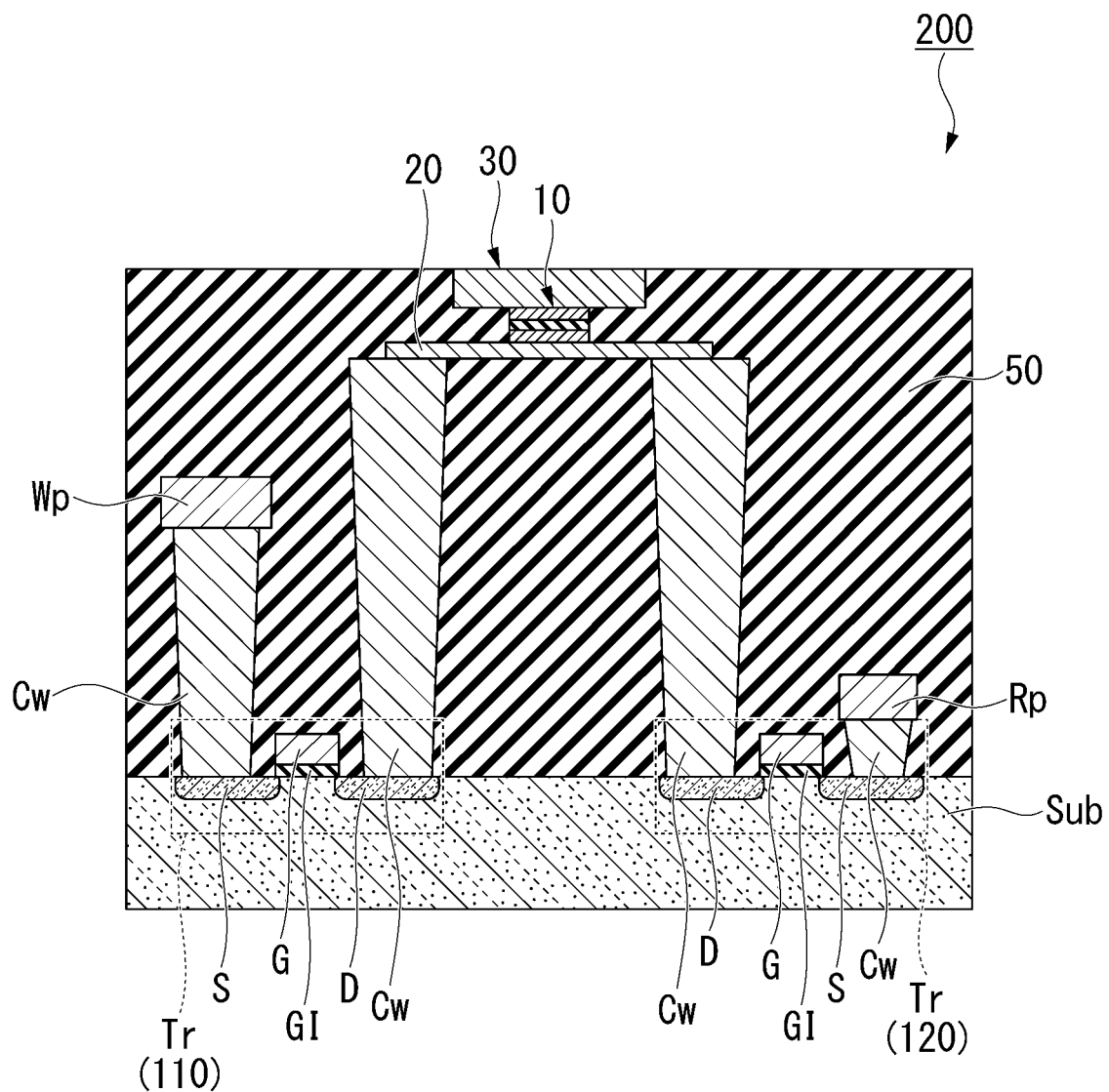
FIG. 2 is a cross-sectional view of a semiconductor device constituting the magnetic recording array according to the first embodiment.

FIG. 2 is a cross-sectional view of a semiconductor device 200 constituting the magnetic recording array 300 according to the first embodiment. FIG. 2 is a cross section of the storage element 100 along an xz plane passing through the center of the width of a first wiring 20 that will be described later in the y direction. The semiconductor device 200 has the storage element 100 and the plurality of switching elements (the first switching element 110, the second switching element 120, the third switching element 130) connected to the storage element 100. The third switching element 130 is not present on the cross section shown in FIG. 2 and is located, for example, on a side in a paper surface depth direction (−y direction).

Each of the first switching element 110 and the second switching element 120 shown in FIG. 2 is a transistor Tr. The transistor Tr has a gate electrode G, a gate insulating film GI, and a source region S and a drain region D which are formed on a substrate Sub. The substrate Sub is, for example, a semiconductor substrate.

Each of the transistors Tr and the storage element 100, the write wiring Wp and the read wiring Rp are electrically connected to each other via the conductive portion Cw. The conductive portion Cw is also referred to as, for example, a connection wiring or a via wiring. The conductive portion Cw contains a material having conductivity. The conductive portion Cw extends in the z direction.

The storage element 100 and the transistor Tr are electrically separated by an insulating layer 50 except for the conductive portion Cw. The insulating layer 50 is an insulating layer that insulates a portion between the wirings arranged in multiple layers and a portion between the elements. The insulating layer 50 includes, for example, silicon oxide ($SiO_x$), silicon nitride ($SiN_x$), silicon carbide (SiC), chromium nitride, silicon carbonitride (SiCN), silicon oxynitride (SiON), aluminum oxide ($Al_2O_3$), zirconium oxide (ZrOx), and the like.

Figure 3:
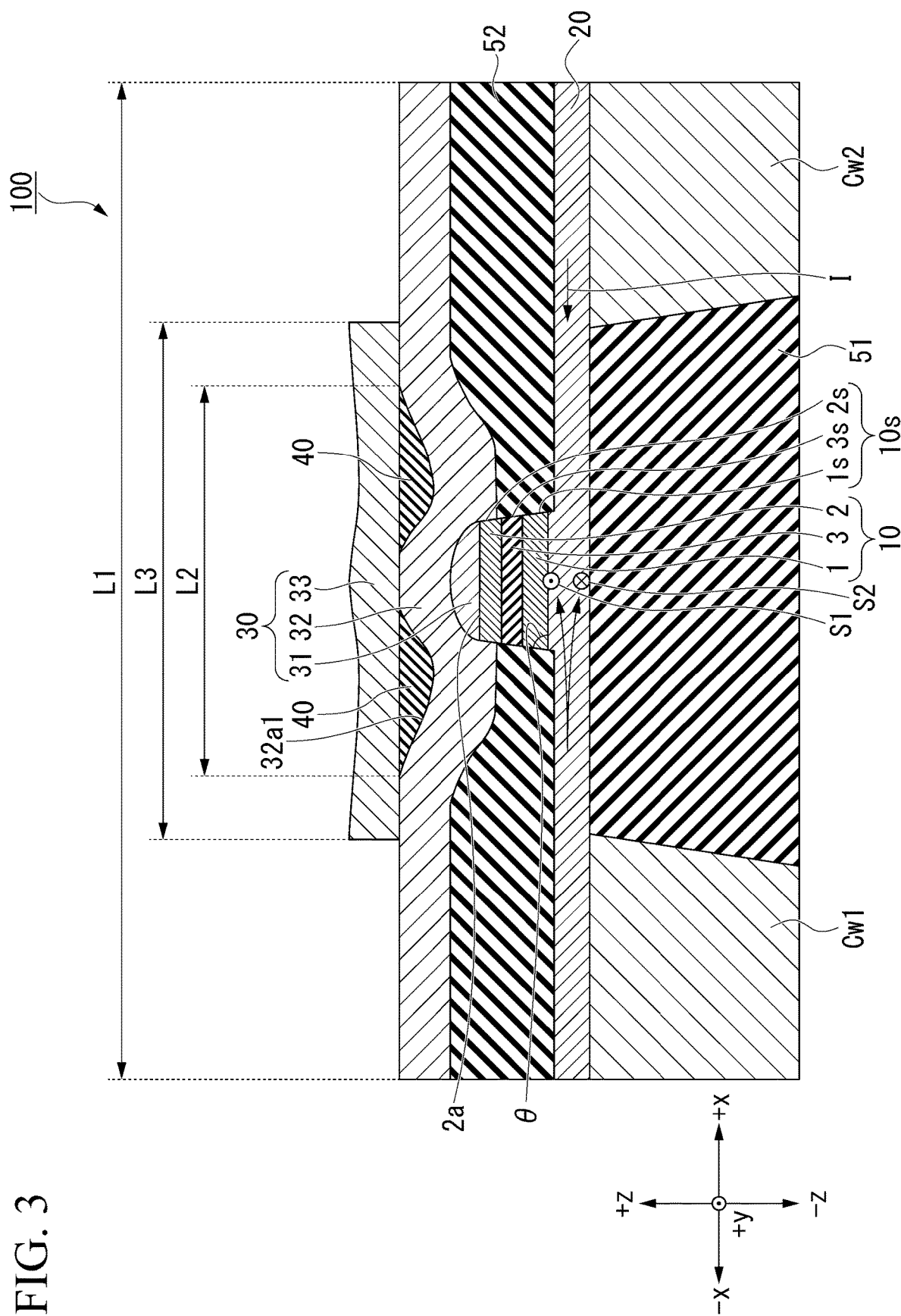
FIG. 3 is a cross-sectional view of a storage element constituting the magnetic recording array according to the first embodiment.
Figure 4:
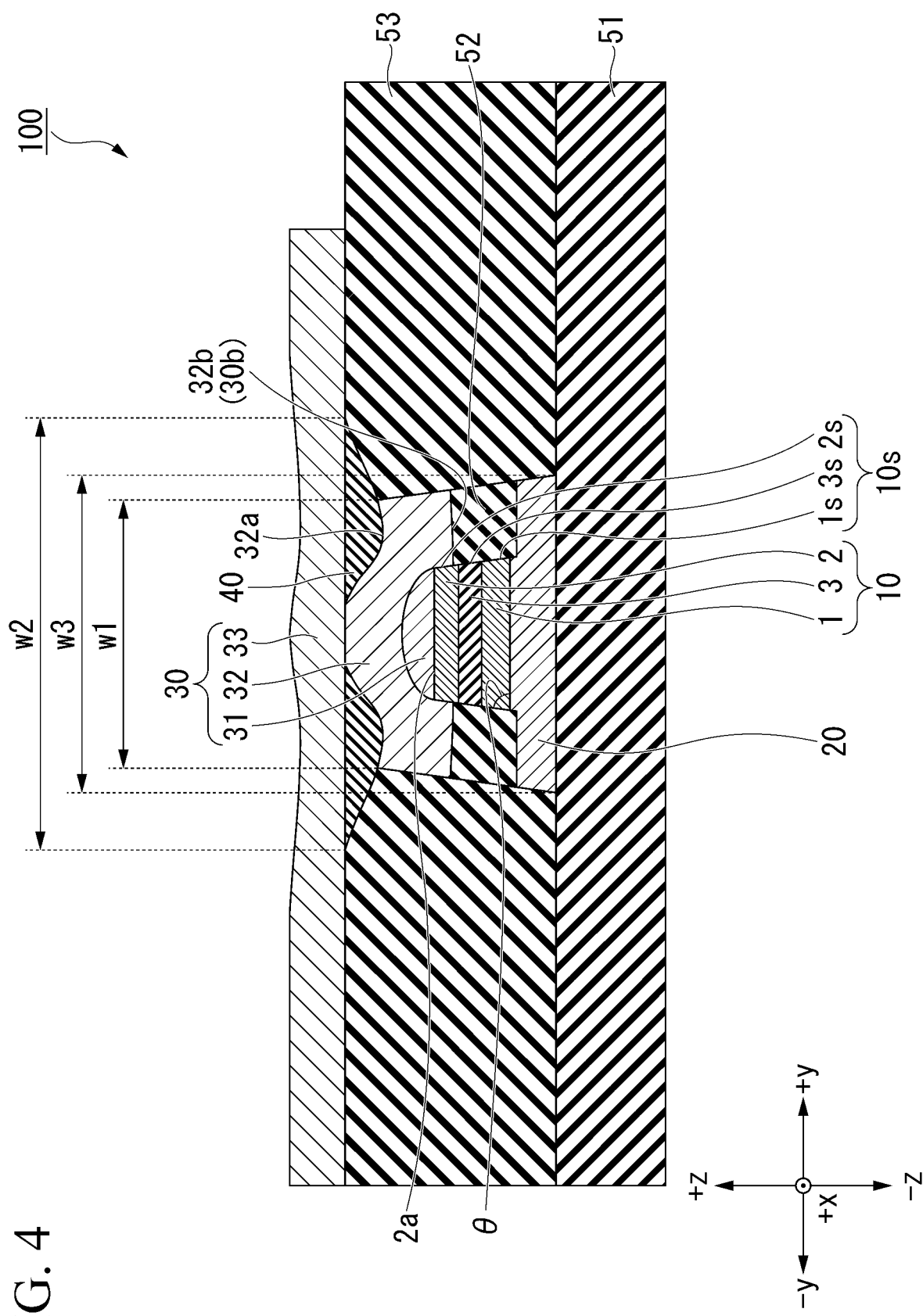
FIG. 4 is a cross-sectional view of the storage element constituting the magnetic recording array according to the first embodiment.
Figure 5:
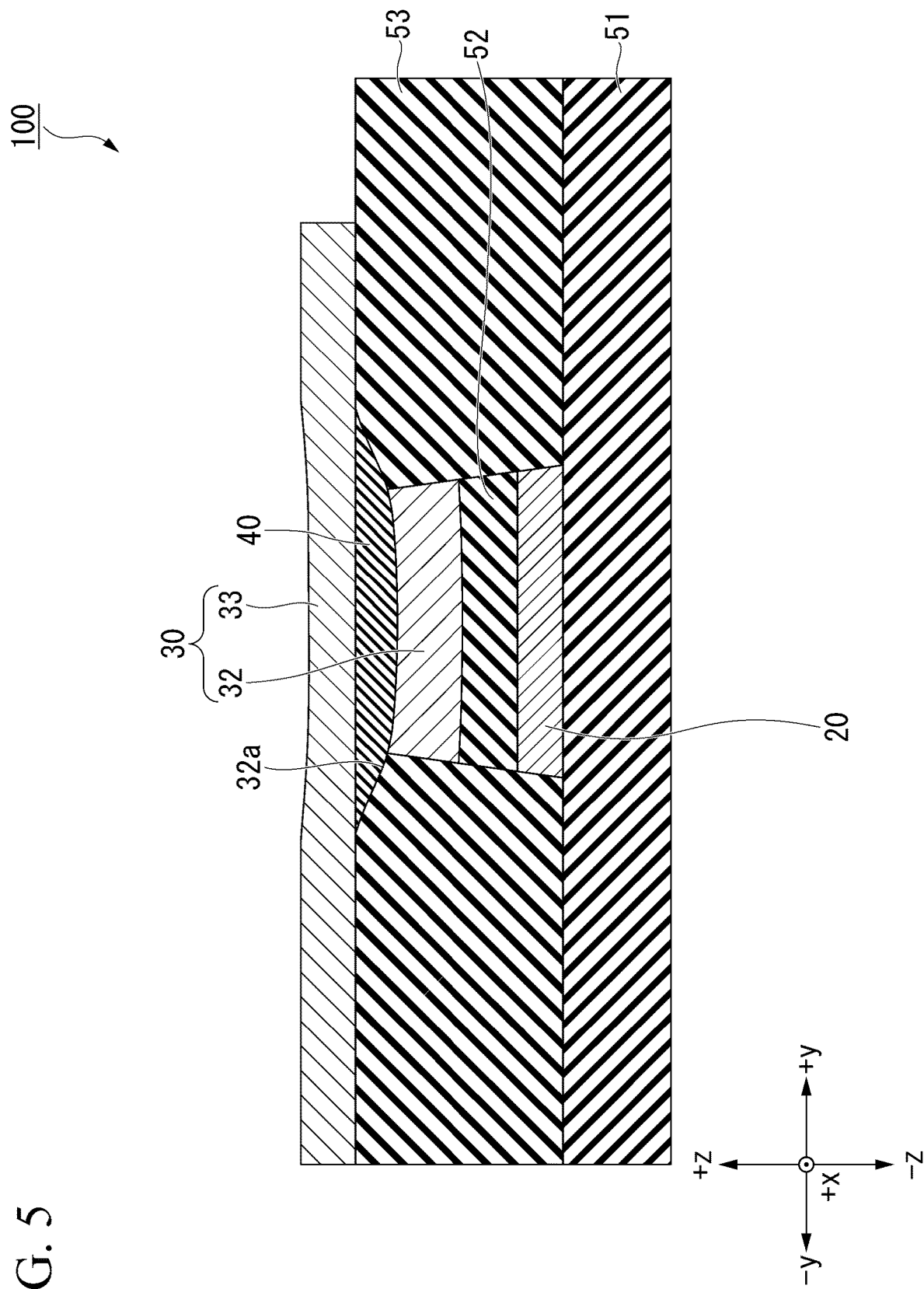
FIG. 5 is a cross-sectional view of the storage element constituting the magnetic recording array according to the first embodiment.
Figure 6:
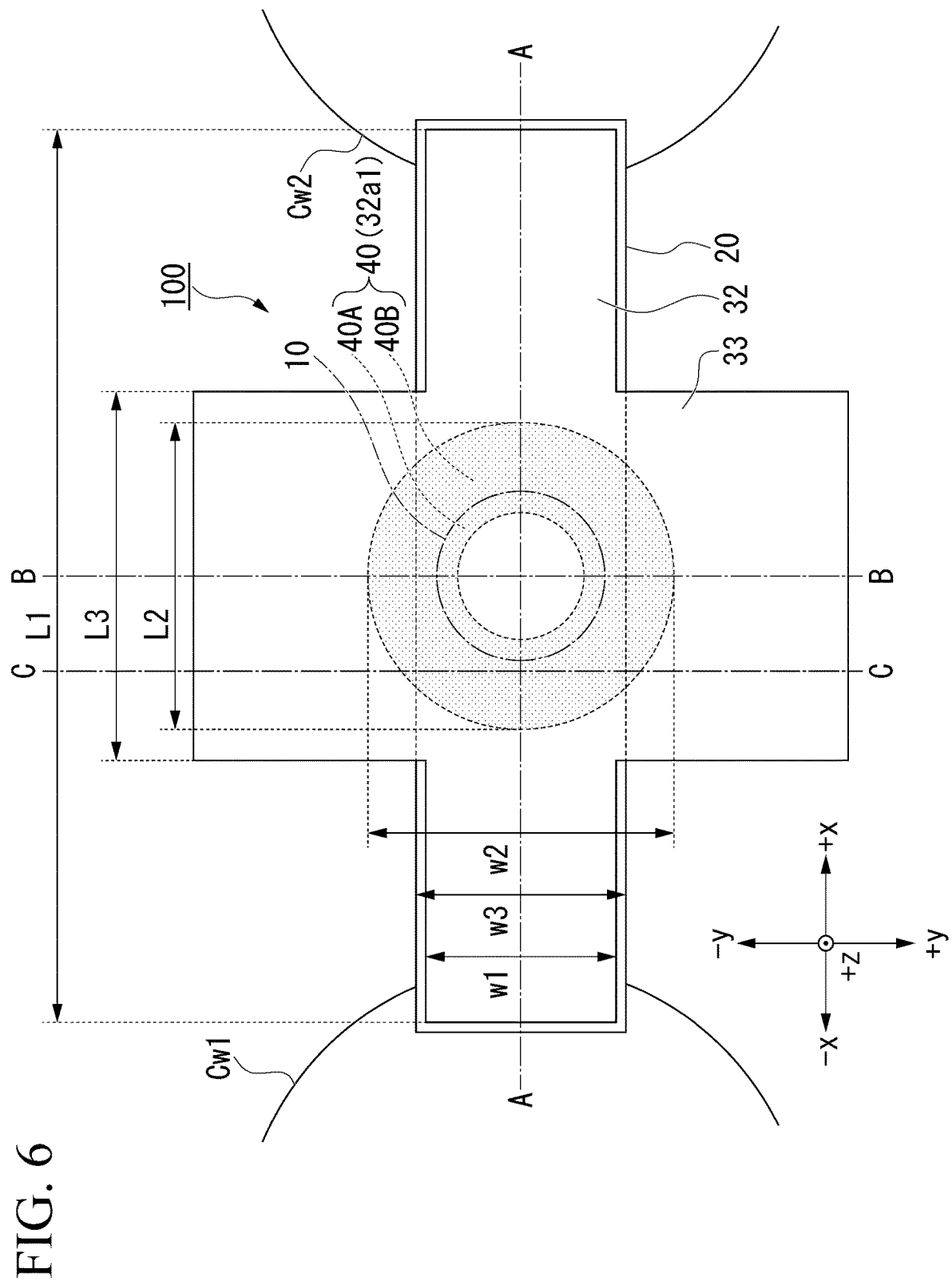
FIG. 6 is a plan view of the storage element constituting the magnetic recording array according to the first embodiment.

FIGS. 3 to 5 are cross-sectional views of the storage element 100 constituting the magnetic recording array 300 according to the first embodiment. FIG. 6 is a plan view of the storage element 100 constituting the magnetic recording array 300 according to the first embodiment. FIG. 3 is a cross section along the xz plane passing through the center of the width of a first wiring 20 in the y direction (a plane along line A-A in FIG. 6). FIG. 4 is a cross section along a yz plane passing through the center of the width of a magnetoresistance effect element 10 in the x direction (a plane along line B-B in FIG. 6). FIG. 5 is a cross section along a yz plane passing through the center position Pc (see FIG. 7) of a compound portion 40 that will be described later in the x direction (a plane along line C-C in FIG. 6).

The storage element 100 includes the magnetoresistance effect element 10, the first wiring 20, an electrode 30, a compound portion 40, a first conductive portion Cw1, and a second conductive portion Cw2. Each of insulating layers 51, 52, and 53 in FIGS. 3 to 5 is a part of the insulating layer 50 in FIG. 2. The storage element 100 is a spin element that performs magnetization rotation using a spin-orbit torque (SOT) and may be referred to as a spin-orbit torque magnetization rotational element, a spin-orbit torque magnetization reversing element, or a spin-orbit torque magnetoresistance effect element.

The magnetoresistance effect element 10 is interposed between the first wiring 20 and the electrode 30. The magnetoresistance effect element 10 is, for example, a columnar body having a circular shape in a plan view in the z direction. The shape of the magnetoresistance effect element 10 in a plan view in the z direction is not limited to a circle and may be, for example, an ellipse or a rectangle. The outer peripheral length or diameter of the magnetoresistance effect element 10 increases as the distance from the electrode 30 increases, for example. A lateral side surface 10s of the magnetoresistance effect element 10 is, for example, inclined at an inclination angle θ with respect to an xy plane. The lateral side surface 10s of the magnetoresistance effect element 10 includes a lateral side surface 1s of a first ferromagnetic layer 1, a lateral side surface 2s of a second ferromagnetic layer 2, and a lateral side surface 3s of a nonmagnetic layer 3.

The magnetoresistance effect element 10 has the first ferromagnetic layer 1, the second ferromagnetic layer 2, and the nonmagnetic layer 3. The first ferromagnetic layer 1 faces the first wiring 20. The second ferromagnetic layer 2 faces the electrode 30. The nonmagnetic layer 3 is interposed between the first ferromagnetic layer 1 and the second ferromagnetic layer 2.

The first ferromagnetic layer 1 and the second ferromagnetic layer 2 each have magnetization. The magnetization of the second ferromagnetic layer 2 is less likely to change in an orientation direction than the magnetization of the first ferromagnetic layer 1 when a predetermined external force is applied. The first ferromagnetic layer 1 may be referred to as a magnetization free layer, and the second ferromagnetic layer 2 may be referred to as a magnetization fixed layer or a magnetization reference layer. A resistance value of the magnetoresistance effect element 10 changes according to a difference in relative angle of magnetization between the first ferromagnetic layer 1 and the second ferromagnetic layer 2 sandwiching the nonmagnetic layer 3. The magnetization of the first ferromagnetic layer 1 and the second ferromagnetic layer 2 is, for example, oriented in the z direction or any direction in the xy plane.

The first ferromagnetic layer 1 and the second ferromagnetic layer 2 contain a ferromagnetic material. The ferromagnetic material is, for example, a metal selected from the group consisting of Cr, Mn, Co, Fe, and Ni, an alloy containing one or more of these metals, an alloy containing these metals and at least one or more elements of B, C, and N, or the like. The ferromagnetic material is, for example, a Co—Fe alloy, a Co—Fe—B alloy, a Ni—Fe alloy, a Co—Ho alloy, a Sm—Fe alloy, an Fe—Pt alloy, a Co—Pt alloy, or a CoCrPt alloy.

The first ferromagnetic layer 1 and the second ferromagnetic layer 2 may contain a Heusler alloy. A Heusler alloy contains an intermetallic compound with an XYZ or $X_2YZ$ chemical composition. X is a transition metal element or noble metal element from the Co, Fe, Ni, or Cu groups in the periodic table, Y is a transition metal element from the Mn, V, Cr, or Ti groups in the periodic table or the same types of element as for X, and Z is a typical element from Groups III to V in the periodic table. The Heusler alloy is, for example, $Co_2FeSi$, $Co_2FeGe$, $Co_2FeGa$, $Co_2MnSi$, $Co_2Mn_{1-a}Fe_aAl_bSi_{1-b}$, $Co_2FeGe_{1-c}Ga_c$, or the like. The Heusler alloy has a high spin polarization.

The magnetoresistance effect element 10 may have an antiferromagnetic layer on a surface of the second ferromagnetic layer 2 opposite to the nonmagnetic layer 3 via a spacer layer. The second ferromagnetic layer 2, the spacer layer, and the antiferromagnetic layer form a synthetic antiferromagnetic structure (an SAF structure). The synthetic antiferromagnetic structure is constituted by two magnetic layers with a nonmagnetic layer interposed therebetween. Antiefffomagnetic coupling between the second ferromagnetic layer 2 and the antiferromagnetic layer increases a coercivity of the second ferromagnetic layer 2 as compared with a case without the antiferromagnetic layer. The antiferromagnetic layer is, for example, IrMn, PtMn, or the like. The spacer layer contains, for example, at least one selected from the group consisting of Ru, Ir, and Rh.

The magnetoresistance effect element 10 may have a layer other than the first ferromagnetic layer 1, the second ferromagnetic layer 2, and the nonmagnetic layer 3. For example, an underlayer may be provided between the first wiring 20 and the magnetoresistance effect element 10. Further, for example, a cap layer may be provided between the electrode 30 and the magnetoresistance effect element 10. The underlayer and the cap layer enhance a crystallinity of each layer constituting the magnetoresistance effect element 10.

The first wiring 20 extends in the x direction. When seen in the z direction, the length of the first wiring 20 in the x direction is, for example, longer than that in the y direction. The first wiring 20 faces the first ferromagnetic layer 1 of the magnetoresistance effect element 10. At least a part of the first wiring 20 sandwiches the first ferromagnetic layer 1 in the z direction together with the nonmagnetic layer 3.

The first wiring 20 contains any one of a metal, an alloy, an intermetallic compound, a metal boride, a metal carbide, a metal silicide, and a metal phosphide which have a function of generating a spin current due to a spin Hall effect when a current I flows. The first wiring 20 may be referred to as a spin-orbit torque wiring.

The spin Hall effect is a phenomenon in which the spin current is induced in a direction orthogonal to a direction in which the current flows, based on spin-orbit interaction when the current flows. The spin Hall effect is the same as a normal Hall effect in that a movement (traveling) direction of moving (traveling) charges (electrons) is bent. In the normal Hall effect, the movement direction of charged particles moving in a magnetic field is bent with a Lorentz force. On the other hand, in the spin Hall effect, even if a magnetic field is absent, the movement direction of the spins is bent only due to the movement of electrons (only due to the flowing current).

The first wiring 20 generates the spin current due to the spin Hall effect when the current I flows. When the current I flows through the first wiring 20, a first spin S1 oriented in one direction and a second spin S2 oriented in a direction opposite to the first spin S1 are each bent in a direction orthogonal to a direction in which each current I flows due to the spin Hall effect. For example, the first spin S1 oriented in a +y direction is bent in the +z direction, and the second spin S2 oriented in a −y direction is bent in the −z direction.

In a nonmagnetic material (a material that is not a ferromagnetic material), the number of electrons in the first spin S1 and the number of electrons in the second spin S2 which are generated by the spin Hall effect are equal to each other. That is, the number of electrons in the first spin S1 which are moving in the +z direction is equal to the number of electrons in the second spin S2 which are moving in the −z direction. The first spin S1 and the second spin S2 flow in a direction of eliminating uneven distribution of the spins. In the movement of the first spin S1 and the second spin S2 in the z direction, the flows of the charges cancel each other out, so that the amount of the current becomes zero. A spin current without a current is particularly referred to as a pure spin current.

When the flow of electrons in the first spin S1 is represented as $J_\uparrow$, the flow of electrons in the second spin S2 is represented as $J_\downarrow$, and the spin current is represented as $J_S$, $J_S = J_\uparrow - J_\downarrow$ is defined. The spin current $J_S$ is generated in the z direction. The first spin S1 is injected into the first ferromagnetic layer 1 facing the first wiring 20. For example, the first wiring 20 provides a SOT sufficient to reverse the magnetization of the first ferromagnetic layer 1 for the magnetization of the first ferromagnetic layer 1.

The main component of the first wiring 20 is preferably a nonmagnetic heavy metal. The heavy metal means a metal having a specific gravity of yttrium (Y) or more. The nonmagnetic heavy metal is preferably a nonmagnetic metal having a d-electron or an f-electron in the outermost shell and having a large atomic number of 39 or more. The first wiring 20 is, for example, Hf, Ta, or W. In the nonmagnetic heavy metal, the spin-orbit interaction is more strongly caused than in other metals. The spin Hall effect is caused by the spin-orbit interaction, and the spins are likely to be unevenly distributed in the first wiring 20, and the spin current $J_S$ is likely to be generated.

The first wiring 20 may contain a magnetic metal. The magnetic metal is a ferromagnetic metal or an antiferromagnetic metal. A trace amount of the magnetic metal contained in the nonmagnetic material becomes a scattering factor of spins. For example, the trace amount is 3% or less of the total of molar ratios of the elements constituting the first wiring 20. When the spins are scattered by the magnetic metal, the spin-orbit interaction is enhanced, and the efficiency of the spin current generation with respect to the current increases.

The first wiring 20 may include a topological insulator. A topological insulator is a material in which the interior of the material is an insulator or a high resistance body and a spin-polarized metal state is generated on its surface. In a topological insulator, an internal magnetic field is generated due to the spin-orbit interaction. In a topological insulator, a new topological phase develops due to the effect of the spin-orbit interaction even in the case where there is no external magnetic field. A topological insulator can generate a pure spin current with high efficiency due to a strong spin-orbit interaction and breaking of inversion symmetry at an edge.

The topological insulator is, for example, SnTe, $Bi_{1.5}Sb_{0.5}Te_{1.7}Se_{1.3}$, $TlBiSe_2$, $Bi_2Te_3$, $Bi_{1-x}Sb_x$, $(Bi_{1-x}Sb_x)_2Te_3$, or the like. The topological insulator can generate spin currents with high efficiency.

The electrode 30 faces the second ferromagnetic layer 2 of the magnetoresistance effect element 10. The electrode 30 is in contact with a first surface 2a and the lateral side surface 2s of the second ferromagnetic layer 2, for example. The first surface 2a is a surface of the second ferromagnetic layer 2 opposite to the nonmagnetic layer 3. The electrode 30 may be in contact with the lateral side surface 3s of the nonmagnetic layer 3 but is not in contact with the lateral side surface 1s of the first ferromagnetic layer 1. If the lateral side surface 1s of the first ferromagnetic layer 1 comes into contact with the electrode 30, the read current cannot be appropriately applied in the z direction of the magnetoresistance effect element 10. At least a part of the electrode 30 sandwiches the second ferromagnetic layer 2 together with the nonmagnetic layer 3.

Figure 7:
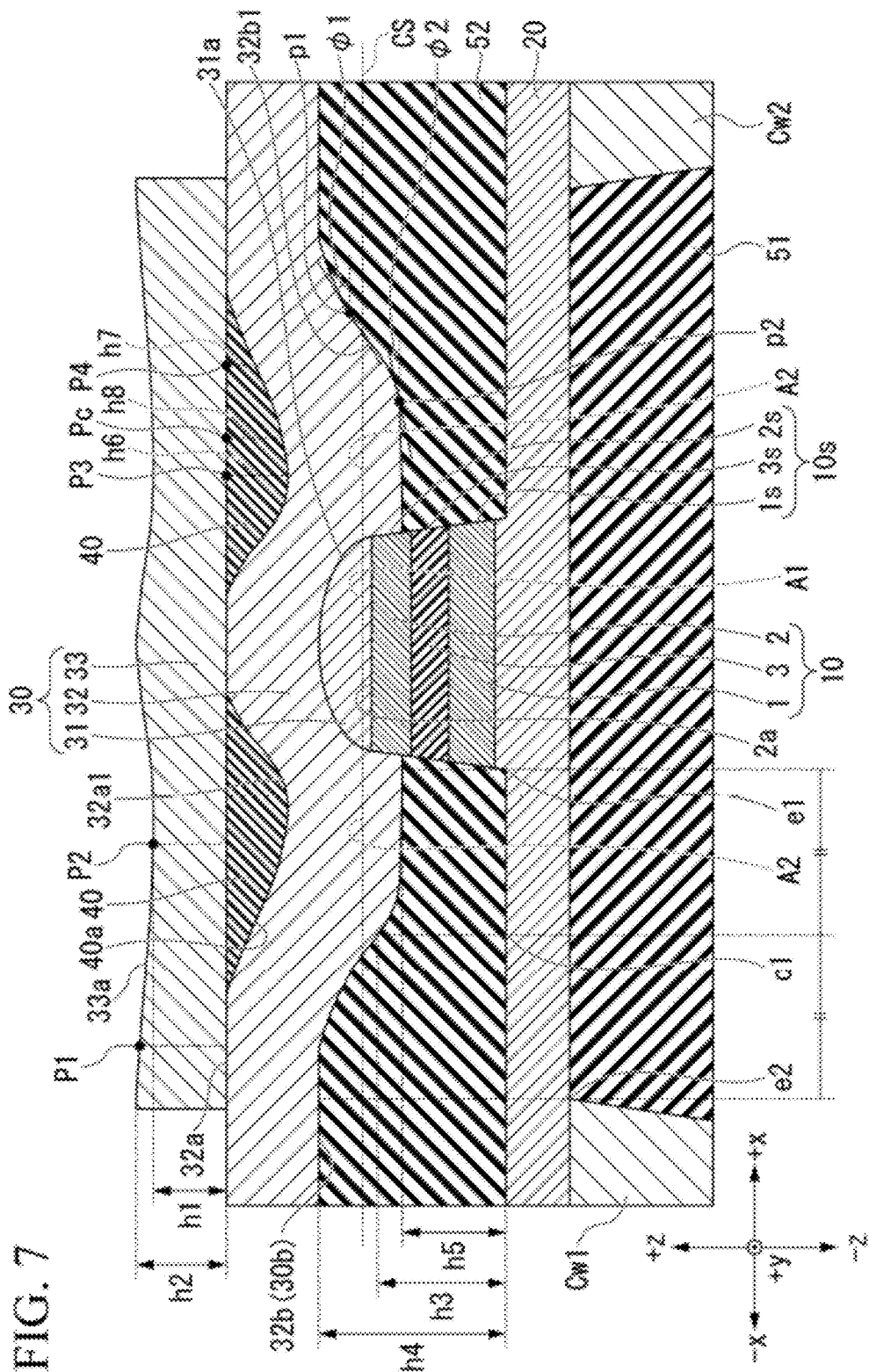
FIG. 7 is a cross-sectional view of the main part of the storage element constituting the magnetic recording array according to the first embodiment.

The electrode 30 has, for example, a first section 31, a second section 32, and a third section 33. FIG. 7 is a cross-sectional view of the storage element 100 constituting the magnetic recording array 300 according to the first embodiment. FIG. 7 is an enlarged view of the vicinity of the magnetoresistance effect element 10 of FIG. 3. The first section 31 is located at a position overlapping the second ferromagnetic layer 2 in the z direction and covers the first surface 2a of the second ferromagnetic layer 2. The second section 32 covers the first section 31, extends in the x direction, and is in contact with the lateral side surface 2s of the second ferromagnetic layer 2. The third section 33 is in contact with the second section 32.

Each of the first section 31 and the second section 32 is, for example, a part of a hard mask which is used in a manufacturing process of the storage element 100. The first section 31 and the second section 32 are, for example, harder than the third section 33. The first section 31 is, for example, a part of a first hard mask used when the magnetoresistance effect element 10 is processed into a predetermined shape. The second section 32 is, for example, a part of a second hard mask used when the first wiring 20 is processed into a predetermined shape. The first section 31 and the second section 32 may include a plurality of layers. The first section 31 and the second section 32 include, for example, Al, Cu, Ta, Ti, Zr, NiCr, a nitride (for example, TiN, TaN, or SiN), and an oxide (for example, $SiO_2$). Each of the first section 31 and the second section 32 is, for example, a stacked body of NiCr and Ta.

For example, a first surface 31a of the first section 31 which is a side far from the magnetoresistance effect element 10 is curved. The first surface 31a is curved, for example, in a manufacturing process that will be described later. When the first surface 31a is curved, the adhesion between the first section 31 and the second section 32 is improved. The first surface 31a has, for example, an arc shape. The read current is concentrated and flows from the second section 32 to the first section 31. When the first surface 31a is substantially orthogonal to a direction in which the read current flows, it is possible to suppress local electric field concentration.

The second section 32 extends in the x direction. The length L1 of the second section 32 in the x direction is, for example, longer than the width w1 of the second section 32 in the y direction. The length L1 of the second section 32 in the x direction is substantially the same as the length of the first wiring 20 in the x direction. The length w1 of the second section 32 in the x direction is substantially the same as the width of the first wiring 20 in the y direction. Approximately the same means that the difference in length or width between the first wiring 20 and the second section 32 is within 10% of the length of the first wiring 20 in the x direction or the width of the first wiring 20 in the y direction.

The second section 32 is formed along with the insulating layer 52 and the first section 31. A first surface 32a and a second surface 32b of the second section 32 are curved. The first surface 32a is a surface of the second section 32, and the first surface 32a is a surface on a side far from the first wiring 20, and the second surface 32b is a surface opposite to the first surface 32a. The second surface 32b coincides with a second surface 30b of the electrode 30. The first surface 32a forms a concave portion 32a1 that is concave toward the first wiring 20 with respect to a boundary surface along a boundary between the second section 32 and the third section 33. The concave portion 32a1 is, for example, formed at a position where the magnetoresistance effect element 10 is interposed in the x direction and the y direction. The length L2 of the concave portion 32a1 in the x direction is shorter than the length L1 of the second section 32 in the x direction, and the width w2 of the concave portion 32a1 in the y direction is longer than the width w1 of the second section 32 in the y direction. Further, the width w2 of the concave portion 32a1 in the y direction is longer than the width w3 of the first wiring 20 in the y direction.

The second surface 32b of the second section 32 has an inclined surface 32b1 in part. The inclined surface 32b1 is inclined with respect to the xy plane. The inclination angle φ1 of a tangent plane at a first point φ1 of the inclined surface 32b1 with respect to the xy plane is larger than the inclination angle φ2 of a tangent plane at a second point p2 with respect to the xy plane, for example. The second point p2 is located at a position closer to the second ferromagnetic layer 2 than the first point p1. When the inclination angle of the inclined surface 32b1 with respect to the xy plane gradually decreases toward the second ferromagnetic layer 2, the flow of the read current becomes smooth toward the second ferromagnetic layer 2.

The second section 32 has a lower resistance than the first section 31, for example. In a case in which the first section 31 and the second section 32 are made of the same material, if the area A1 of the first section 31 obtained when the electrode 30 is cut by a cutting surface CS parallel to the xy plane is smaller than the area A2 of the second section 32 obtained when the electrode 30 is cut by the cutting surface CS parallel to the xy plane, the second section 32 has a lower resistance than the first section 31. This is because the wider the region where the read current can flow, the lower the area resistivity. The read current is more likely to flow to the second section 32 than to the first section 31.

The third section 33 is formed on the second section 32 and the compound portion 40 that will be described later. The third section 33 is located at a position overlapping the magnetoresistance effect element 10 in the z direction, for example. The third section 33 is more conductive than the first section 31 and the second section 32. The third section 33 extends in the y direction, for example. The third section 33 is, for example, a wiring that connects the second section 32 to the conductive portion Cw connected to the third switching element 130. The third section 33 is, for example, Cu, Al, Au, or the like.

The length L3 of the third section 33 in the x direction is larger than the distance L2 between the outermost portions of the concave portion 32a1 in the x direction and shorter than the length L1 of the second section 32 in the x direction, for example. When the number of connection parts between the third section 33 and the second section 32 is three, the read current flows through the three connection parts. By dividing the read current into three parts, the current density at each connection part becomes small, and local electric field concentration can be suppressed. Further, by securing a plurality of paths for the read current, it is possible to prevent the read current from not flowing even if any one of the connection parts is peeled off due to distortion or the like.

In the third section 33, the film thickness h1 at a first position P1 overlapping the concave portion 32a1 in the z direction is different from the film thickness h2 at a second position P2 not overlapping the concave portion 32a1 in the z direction, for example. The film thickness h2 of the second position P2 is thicker than the film thickness h1 of the first position P1. The third section 33 has a thick film thickness section and a thin film thickness section alternately, for example. A first surface 33a of the third section 33 is curved in a wavy shape, for example. When the first surface 33a is curved in a wavy shape, the adhesion to other layers is improved. Further, the read current is likely to flow to the thick film thickness section than to the thin film thickness section. At the connection part between the third section 33 and the second section 32, the film thickness of the third section 33 is thick, and the flow of the read current becomes smooth.

The distance between the first wiring 20 and the electrode 30 in the z direction varies depending on a position in the x direction, for example. The distance between the first wiring 20 and the electrode 30 in the z direction is the length of a perpendicular line drawn from the second surface 30b of the electrode 30 toward the first wiring 20 and is equal to the film thickness of the insulating layer 52.

An end of the first ferromagnetic layer 1 on the first conductive portion Cw1 side is referred to as a first end e1, and an end of the first conductive portion Cw1 on the first ferromagnetic layer 1 side is referred to as a second end e2. A point equidistant from the first end e1 and the second end e2 in the x direction is referred to as a midpoint c1. The distances between the first wiring 20 and the electrode 30 at the midpoint c1, the second end e2, and the first end e1 at positions in the x direction are referred to as a first distance h3, a second distance h4, and a third distance h5. The first distance h3 is shorter than the second distance h4 and longer than the third distance h5, for example.

The first wiring 20 generates heat when a write current is applied. The generated heat is dissipated through the first conductive portion Cw1, the second conductive portion Cw2, or the electrode 30. The midpoint c1 is far from any one of the first conductive portion Cw1, the second conductive portion Cw2, and the magnetoresistance effect element 10, and heat is likely to be stored at the midpoint c1. By making the first distance h3 shorter than the second distance h4, it is possible to release the heat stored in the vicinity of the midpoint c1 to a side of the electrode 30. Further, when the distance between the first wiring 20 and the electrode 30 in the z direction becomes shorter in the order of the second distance h4, the first distance h3, and the third distance h5, it is possible to converge the flow of the read current in the second section 32 toward the magnetoresistance effect element 10.

The compound portion 40 is located inside the electrode 30. The compound portion 40 is located, for example, between the second section 32 and the third section 33. The compound portion 40 is formed, for example, in the concave portion 32a1.

The compound portion 40 has a lower thermal conductivity than the electrode. The compound portion 40 is, for example, an oxide, a carbide, a nitride, a sulfide, or a boride. The compound portion 40 is, for example, $SiO_2$, SiN, MgO, AlN, or BN.

The compound portion 40 surrounds the magnetoresistance effect element 10 and surrounds the first ferromagnetic layer 1 when seen in the z direction, for example (see FIG. 6). The compound portion 40 is a ring centered on the magnetoresistance effect element 10 when seen in the z direction, for example. The compound portion 40 sandwiches the first ferromagnetic layer 1 in the x direction and the y direction when seen in the z direction, for example. The shape of a cut surface of the compound portion 40 cut in the yz plane varies depending on the position in the x direction, for example. For example, at an x direction position, the compound portion 40 is confirmed as two separate portions (see FIG. 4), and at another position, the compound portion 40 is confirmed as one continuous portion (see FIG. 5). The width of the compound portion 40 in the y direction is wider than the width of the second section 32 in the y direction, for example.

The compound portion 40 has, for example, a superposition portion 40A that overlaps the first ferromagnetic layer 1 and a non-superimposition portion 40B that does not overlap the first ferromagnetic layer 1 when seen in the z direction. When the area of the superposition portion 40A becomes large, heat is likely to be stored in the first ferromagnetic layer 1. Further, for example, at least a part of the second ferromagnetic layer 2 does not overlap the compound portion 40 in the z direction. That is, for example, the compound portion 40 is not formed in at least a part directly above the second ferromagnetic layer 2. The current is less likely to flow through the compound portion 40 as compared with the electrode 30. When the compound portion 40 is not directly above the second ferromagnetic layer 2, the path for the read current can be secured.

The thickness of the compound portion 40 in the z direction varies depending on the position in the x direction or the y direction, for example. In the compound portion 40, the thickness h6 in the z direction at a third position P3 is thicker than the thickness h7 in the z direction at the fourth position P4. The fourth position P4 is located at a position further away from the first ferromagnetic layer 1 than the third position P3. The thickness of the compound portion 40 is maximized at the third position P3, for example. The third position P3 where the thickness is a maximum is located, for example, at a position closer to the first ferromagnetic layer 1 than a radial center position Pc of the compound portion 40 with respect to the first ferromagnetic layer 1. The thickness h6 in the z direction at the third position P3 is thicker than the thickness h8 in the z direction at the center position Pc, for example.

The first surface 40a of the compound portion 40 on the first wiring 20 side is curved, for example. When the first surface 40a is curved, the local concentration of the read current can be suppressed.

Figure 8:
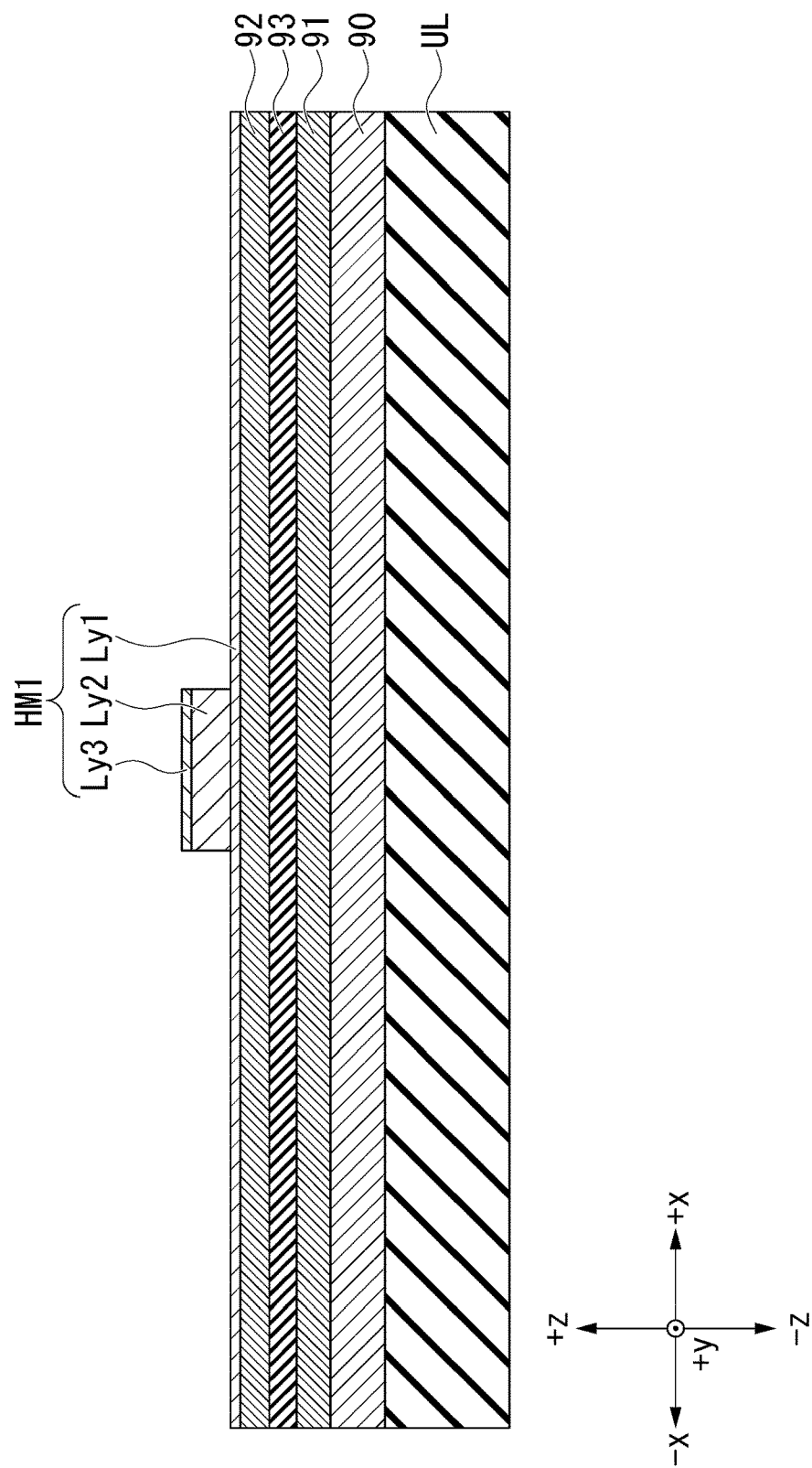
FIG. 8 is a cross-sectional view for explaining a method of manufacturing the storage element constituting the magnetic recording array according to the first embodiment.

Next, a method of manufacturing the storage element 100 will be described. First, as shown in FIG. 8, a conductive layer 90, a magnetic layer 91, a nonmagnetic layer 93, and the magnetic layer 92 are stacked in this order on an underlayer UL. The underlayer UL corresponds to a portion located below the first wiring 20 in FIG. 2 and includes, for example, the insulating layer 50 and the conductive portion Cw. In FIGS. 8 to 12, for convenience, these constituent elements are collectively shown as the underlayer UL. The conductive layer 90, the magnetic layer 91, the nonmagnetic layer 93, and the magnetic layer 92 are stacked using, for example, a sputtering method, a chemical vapor deposition (CVD) method, a vapor deposition method, or the like.

Next, a layer to be the first hard mask is stacked on an upper surface of the magnetic layer 92. The layer to be the first hard mask is processed into a predetermined shape to become a first hard mask HM1. The layer to be the first hard mask has, for example, a first layer Ly1, a second layer Ly2, and a third layer Ly3 from a side closer to the magnetic layer 92. The third layer Ly3 is processed into a predetermined shape by milling via a resist, for example. The second layer Ly2 is processed into a predetermined shape by reactive ion etching (RIE) via the third layer Ly3. The first layer Ly1 functions as a stopper layer for the RIE.

Figure 9:
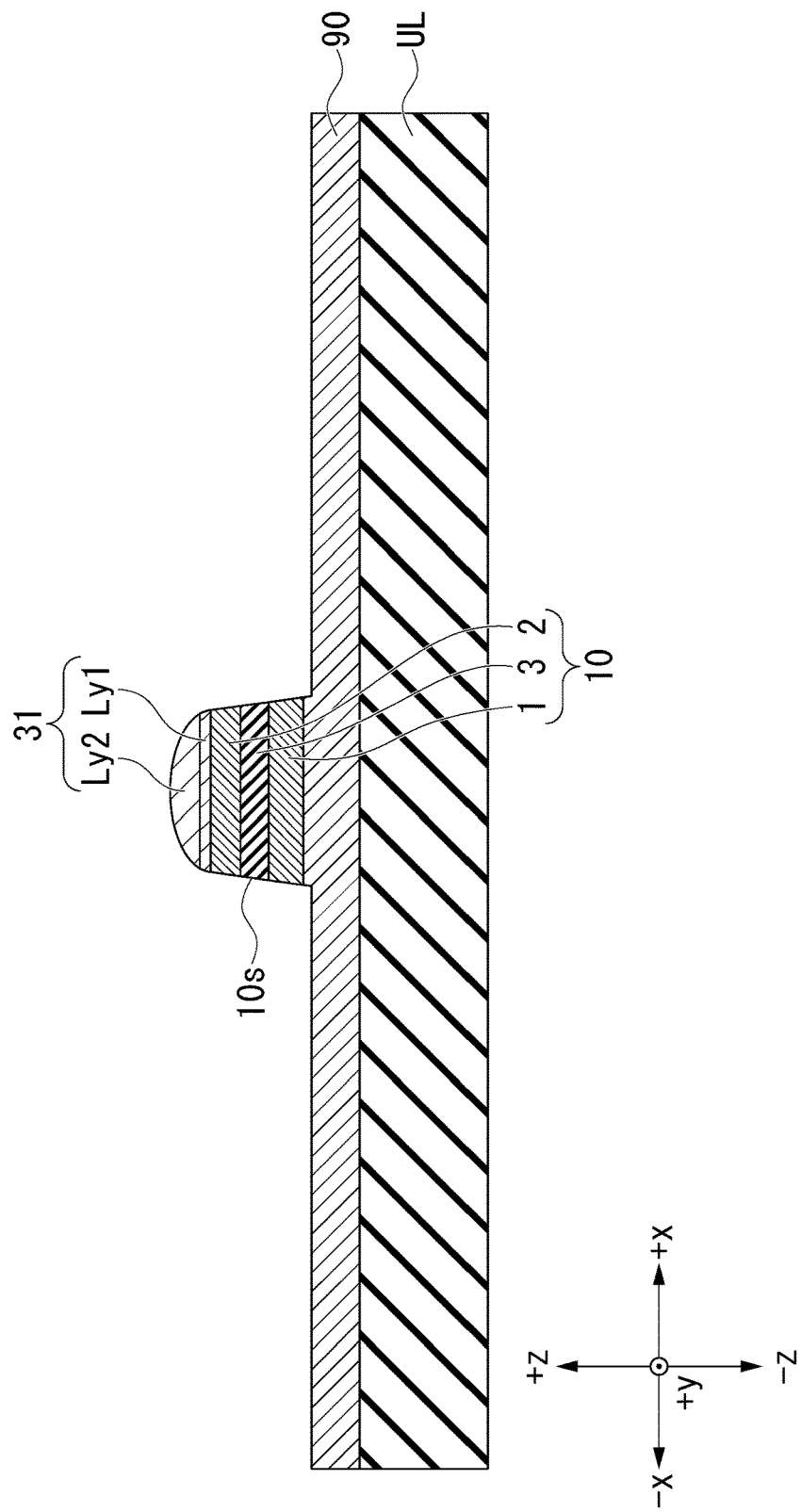
FIG. 9 is a cross-sectional view for explaining the method of manufacturing the storage element constituting the magnetic recording array according to the first embodiment.

Next, as shown in FIG. 9, the magnetic layer 91, the nonmagnetic layer 93, and the magnetic layer 92 are processed into a predetermined shape (for example, a columnar shape). In the magnetic layer 91, the nonmagnetic layer 93, and the magnetic layer 92, a portion covered with the second layer Ly2 remains, and other portions are removed. The vicinity of a surface of the conductive layer 90 may be removed together with the other portions during processing. Further, at the time of processing, the first layer Ly1 may be processed at the same time, and the third layer Ly3 may be removed. The magnetic layer 91, the nonmagnetic layer 93, and the magnetic layer 92 are processed into the first ferromagnetic layer 1, the nonmagnetic layer 3, and the second ferromagnetic layer 2, and the magnetoresistance effect element 10 is formed thereby. The processing is performed by, for example, ion milling. The width of the magnetoresistance effect element 10 in the x direction and the y direction can be narrowed by the first hard mask HM1. A surface of the first hard mask HM1 is curved by processing, and the first hard mask HM1 becomes the first section 31.

Figure 10:
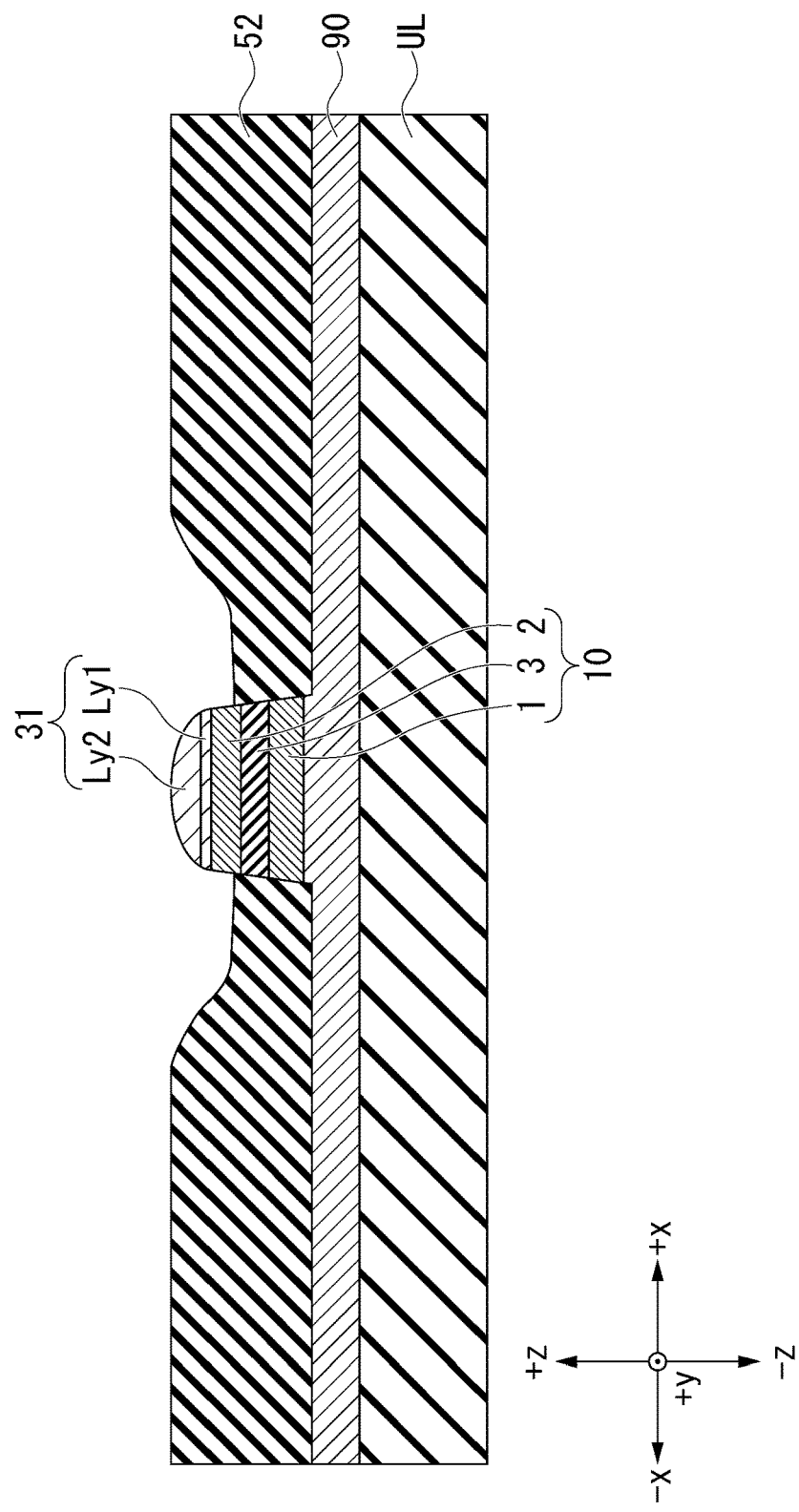
FIG. 10 is a cross-sectional view for explaining the method of manufacturing the storage element constituting the magnetic recording array according to the first embodiment.

Next, an insulating layer is formed to cover the conductive layer 90 and the magnetoresistance effect element 10. The insulating layer is first formed on one surface of each of the conductive layer 90 and the magnetoresistance effect element 10. The insulating layer is formed such that a portion overlapping the magnetoresistance effect element 10 rises. The insulating layer is formed of, for example, two layers made of different materials (for example, $SiO_2$ and $Al_2O_3$ from a side closer to the conductive layer 90). The raised portion of the insulating layer relative to other areas is flattened, for example, by chemical mechanical polishing (CMP). When the number of insulating layers is two, a first layer serves as a stopper film for the CMP. Then, as shown in FIG. 10, a part of the insulating layer around the magnetoresistance effect element 10 is removed until the first section 31 is exposed. The insulating layer is removed, for example, by milling. When a part of the insulating layer is removed, as shown in FIG. 10, the insulating layer 52 is concave around the magnetoresistance effect element 10 as compared with the other portions.

Figure 11:
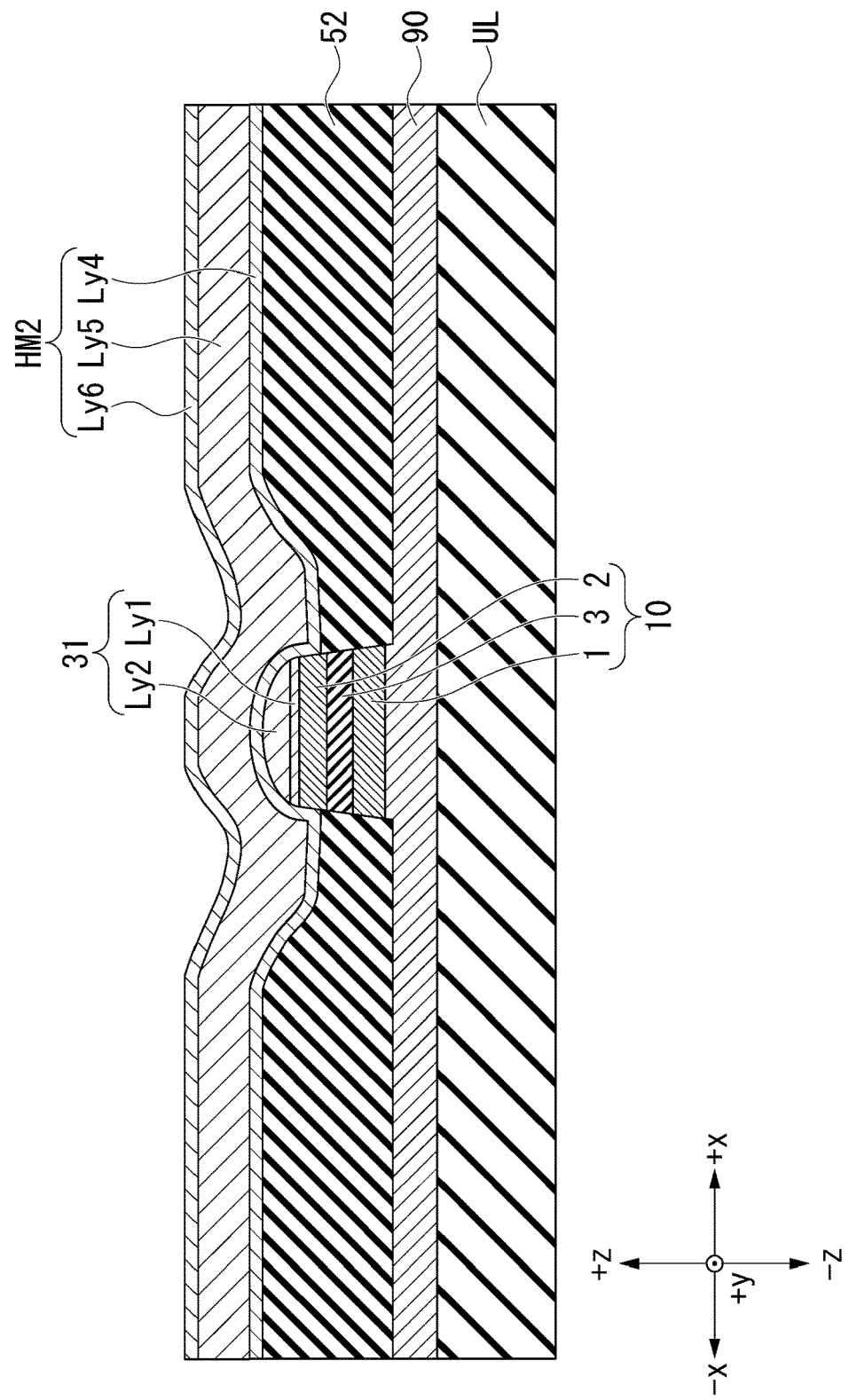
FIG. 11 is a cross-sectional view for explaining the method of manufacturing the storage element constituting the magnetic recording array according to the first embodiment.

Next, as shown in FIG. 11, a second hard mask HM2 is formed on upper surfaces of the insulating layer 52 and the magnetoresistance effect element 10. First, a layer to be the second hard mask is stacked on the upper surfaces of the insulating layer 52 and the magnetoresistance effect element 10. The layer to be the second hard mask is processed into a predetermined shape to become the second hard mask HM2. The layer to be the second hard mask has, for example, a fourth layer Ly4, a fifth layer Ly5, and a sixth layer Ly6 from a side closer to the magnetic layer 93. The sixth layer Ly6 is processed into a predetermined shape by milling via a resist, for example. The fifth layer Ly5 is processed into a predetermined shape by the RIE via the sixth layer Ly6. The fourth layer Ly4 functions as a stopper layer for the RTE.

Next, the conductive layer 90 is patterned into a predetermined shape. In the conductive layer 90, a portion covered with the fifth layer Ly5 remains, and other portions are removed. The conductive layer 90 is patterned in the x direction and the y direction to form the first wiring 20. The fourth layer Ly4 may be patterned together with the conductive layer 90, and the sixth layer Ly6 may be removed. The second hard mask HM2 becomes the second section 32.

Figure 12:
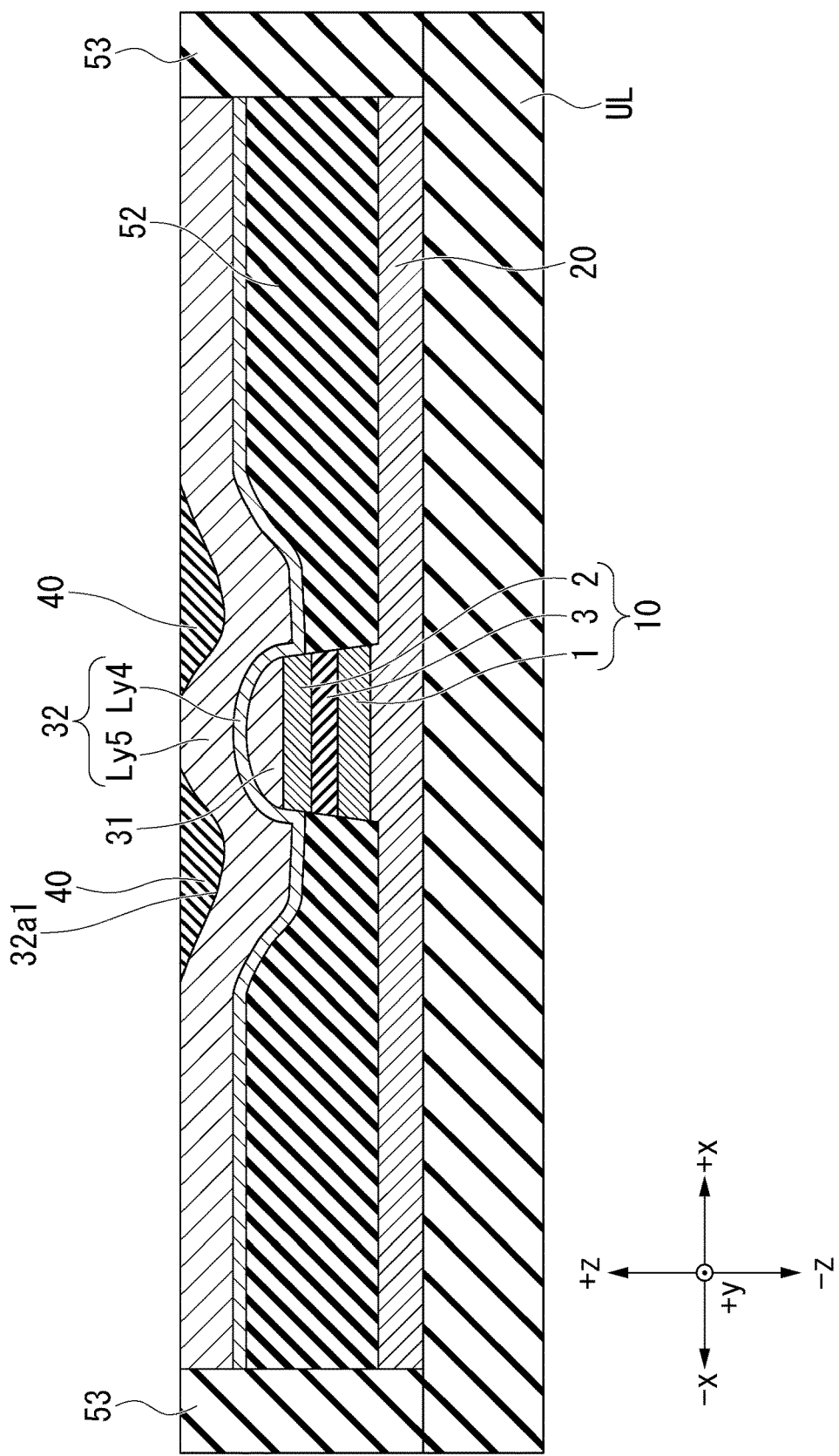
FIG. 12 is a cross-sectional view for explaining the method of manufacturing the storage element constituting the magnetic recording array according to the first embodiment.

Next, an insulating layer is formed to cover the second section 32 and the portions removed by patterning. A portion of the insulating layer overlapping the second section 32 rises in the z direction. The insulating layer is formed of, for example, two layers made of different materials (for example, $SiO_2$ and $Al_2O_3$ from a side closer to the conductive layer 90). The raised portion of the insulating layer relative to other areas is flattened, for example, by chemical mechanical polishing (CMP). When the number of insulating layers is two, a first layer serves as a stopper film for the CMP. Then, a part of the insulating layer is removed until the second section 32 is exposed. The insulating layer is removed, for example, by milling. As shown in FIG. 12, a part of the insulating layer remains in the concave portion 32a1 to become the compound portion 40. Further, as shown in FIG. 12, a part of the insulating layer becomes the insulating layer 53.

Finally, the third section 33 is formed on the upper surfaces of the compound portion 40 and the second section 32, and the storage element 100 shown in FIG. 3 is formed. The manufacturing steps shown here are an example, and another step may be inserted between the steps.

In the storage element 100 of the magnetic recording array 300 according to the present embodiment, the electrode 30 is in contact with the lateral side surface 2s of the second ferromagnetic layer 2. When the contact area between the electrode 30 and the second ferromagnetic layer 2 increases by the amount of the lateral side surface 2s, it is possible to suppress the concentration of the read current on the first surface 2a of the second ferromagnetic layer 2. The concentration of read current produces heat generation or the like and is one of the causes of current loss. By efficiently passing the read current from the electrode 30 to the magnetoresistance effect element 10, it is possible to suppress an increase in the amount of the read current and to suppress the power consumption of the storage element 100.

Further, the configuration in which the electrode 30 and the lateral side surface 2s of the second ferromagnetic layer 2 are in contact with each other is a configuration useful for a storage element using a spin-orbit torque (SOT). For example, in a spin transfer torque (STT) type magnetoresistance effect element, a current (a write current) flows in the z direction of the magnetoresistance effect element not only at the time of reading but also at the time of writing. The write current has a larger current amount than the read current. When the write current flows in the z direction of the magnetoresistance effect element, peeling of the interface may occur due to electromigration. When the write current is concentrated on the lateral side surface 2s of the second ferromagnetic layer 2, the possibility that the lateral side surface 2s and the electrode 30 are separated from each other increases. On the other hand, in the storage element 100 using the SOT, the read current flows in the z direction of the magnetoresistance effect element 10, but the write current does not flow in that direction. Since the current amount of the read current is smaller than that of the write current, the read current is less likely to be a cause of the peeling of the interface due to electromigration.

Further, when the second section 32 having a lower resistance than the first section 31 is in contact with the lateral side surface 2s of the second ferromagnetic layer 2, the read current flows while avoiding the first section 31 having a high resistance. A resistance value of the magnetoresistance effect element 10 in the z direction changes due to a difference in relative angle of a magnetization orientation direction between the two ferromagnetic layers (the first ferromagnetic layer 1 and the second ferromagnetic layer 2) with the nonmagnetic layer 3 interposed therebetween. The storage element 100 stores a difference in resistance value between the magnetoresistance effect elements 10 in the z direction as data. The resistance value of the magnetoresistance effect element 10 in the z direction is the sum of a variable resistance that changes due to the magnetoresistance effect and an inherent specified resistance such as a contact resistance and a parasitic resistance. As a ratio of the variable resistance to the resistance value of the magnetoresistance effect element 10 increases, an MR ratio of the magnetoresistance effect element 10 is improved. The first section 31 having a high resistance is a parasitic resistor and is an example of a specified resistor. When the read current flows while avoiding the first section 31, the MR ratio of the magnetoresistance effect element 10 is improved, and the reliability of the data of the storage element 100 is improved.

In the above, an example of the first embodiment has been described in detail, but the present invention is not limited to this example, and various modifications and changes can be made within the scope of the gist of the present invention described in the claims.

First Modified Example

Figure 13:
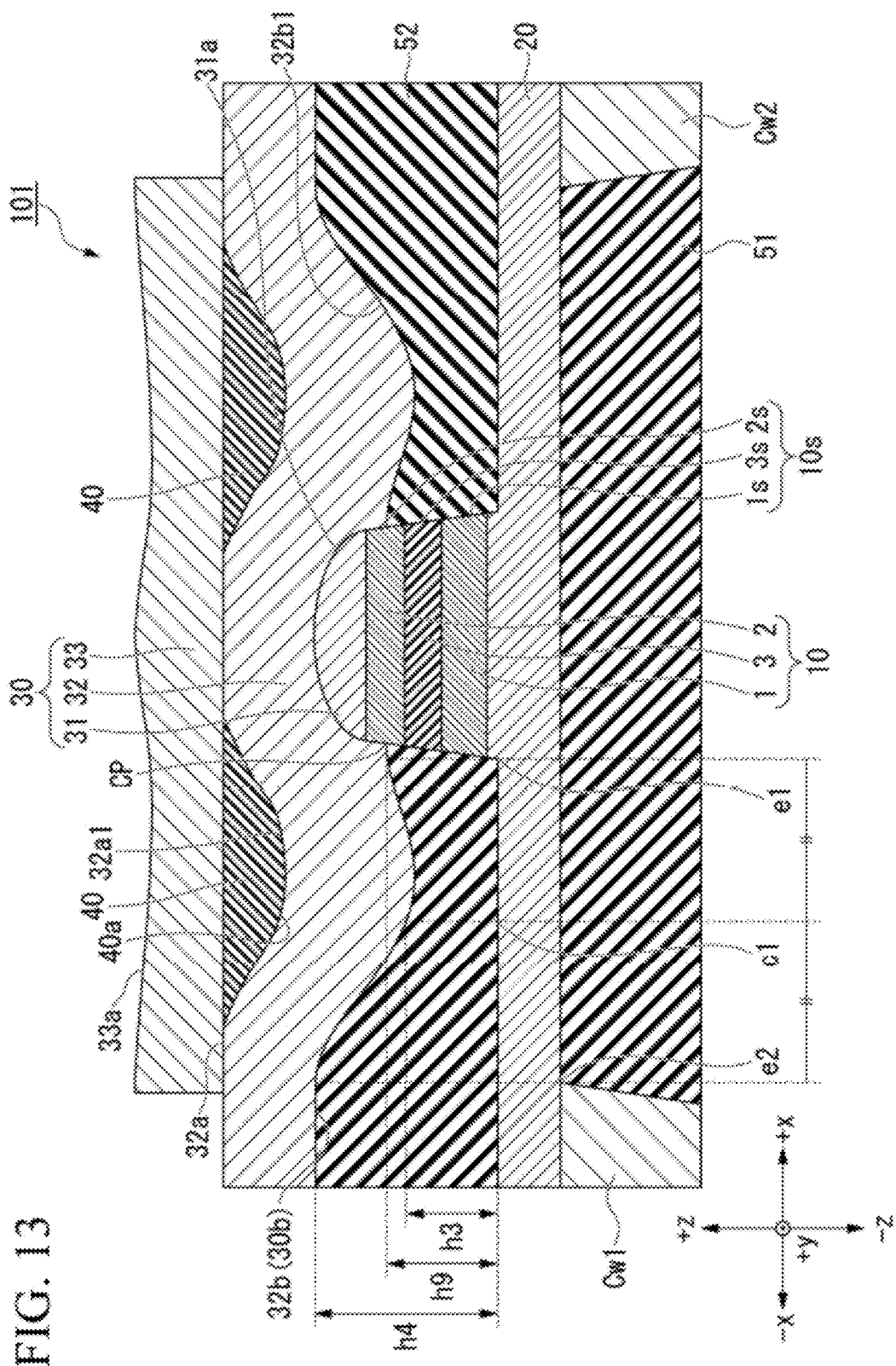
FIG. 13 is a plan view of a storage element according to a first modified example.

FIG. 13 is a cross-sectional view of a storage element 101 according to a first modified example. FIG. 13 is an enlarged view of the vicinity of the magnetoresistance effect element 10. In the storage element 101 according to the first modified example, the shape of the second section 32 is different from that in the storage element 100 according to the first embodiment. Other constituent elements are the same as those of the storage element 100, the same reference signs are given to the same constituent elements, and the description thereof will be omitted.

The first distance h3 at the midpoint c1 is shorter than a distance h9 between the first wiring 20 and the electrode 30 at an intersection CP between the electrode 30 and the second ferromagnetic layer 2. In a case in which the electrode 30 reaches the nonmagnetic layer 3, the first distance h3 at the midpoint c1 is shorter than a distance between the first wiring 20 and the electrode 30 at an intersection between the electrode 30 and the nonmagnetic layer 3. That is, the second surface 30b of the electrode 30 at the same position in the x direction as the midpoint c1 is located closer to the first wiring 20 than the intersection CP. The second surface 30b of the electrode 30 is closest to the first wiring 20 at the same position in the x direction as the midpoint c1, for example.

The first wiring 20 generates heat when a write current is applied. The midpoint c1 is a portion where the generated heat is difficult to be released. By making the first distance h3 at the midpoint c1 shorter, it is possible to efficiently release the heat stored in the vicinity of the midpoint c1 to the electrode 30 side.

Further, in the storage element 101, the electrode 30 is in contact with the lateral side surface 2s of the second ferromagnetic layer 2, and thus it is possible to efficiently pass the read current from the electrode 30 to the magnetoresistance effect element 10 and to suppress the power consumption of the storage element 100.

Second Modified Example

Figure 14:
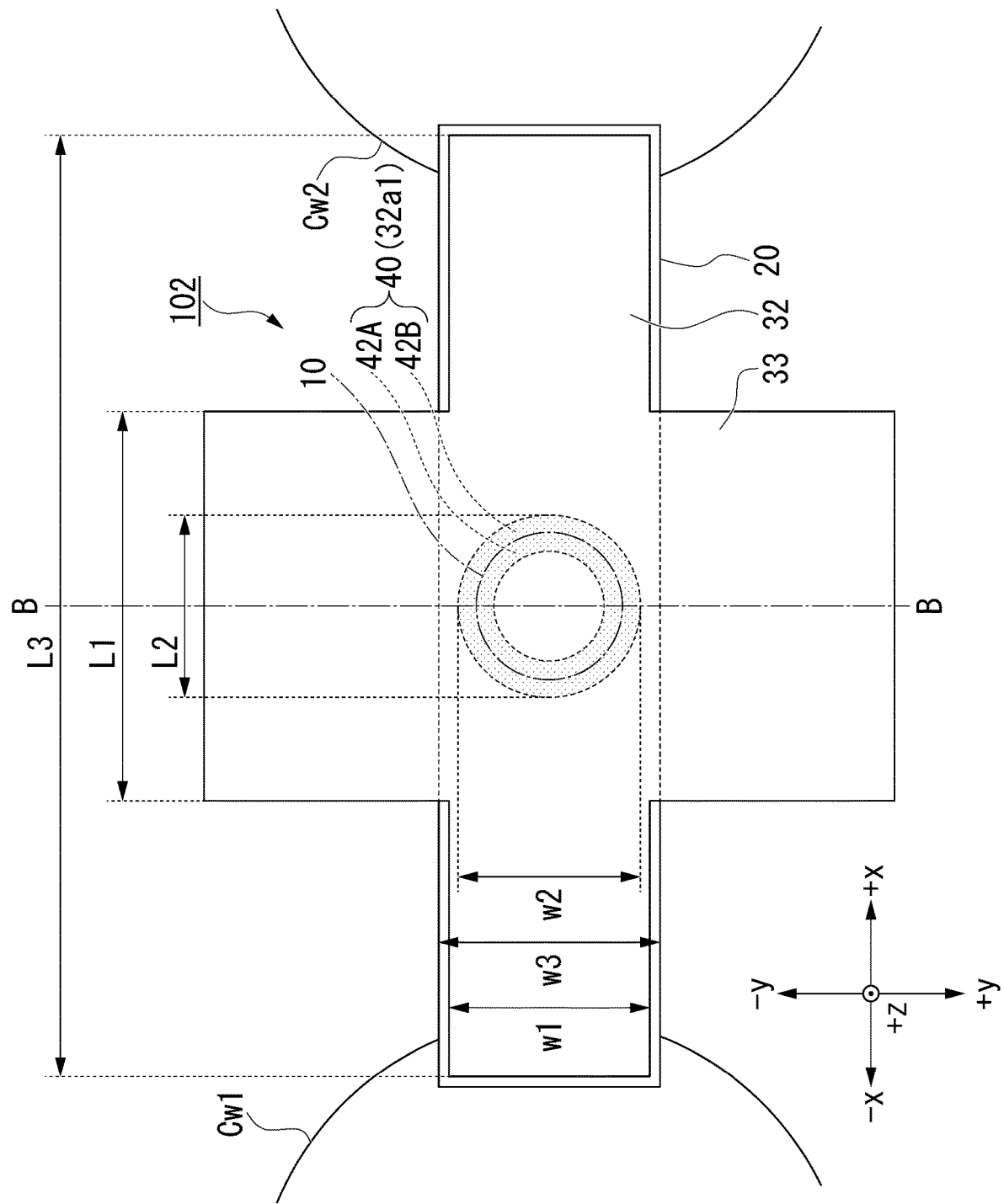
FIG. 14 is a plan view of a storage element according to a second modified example.
Figure 15:
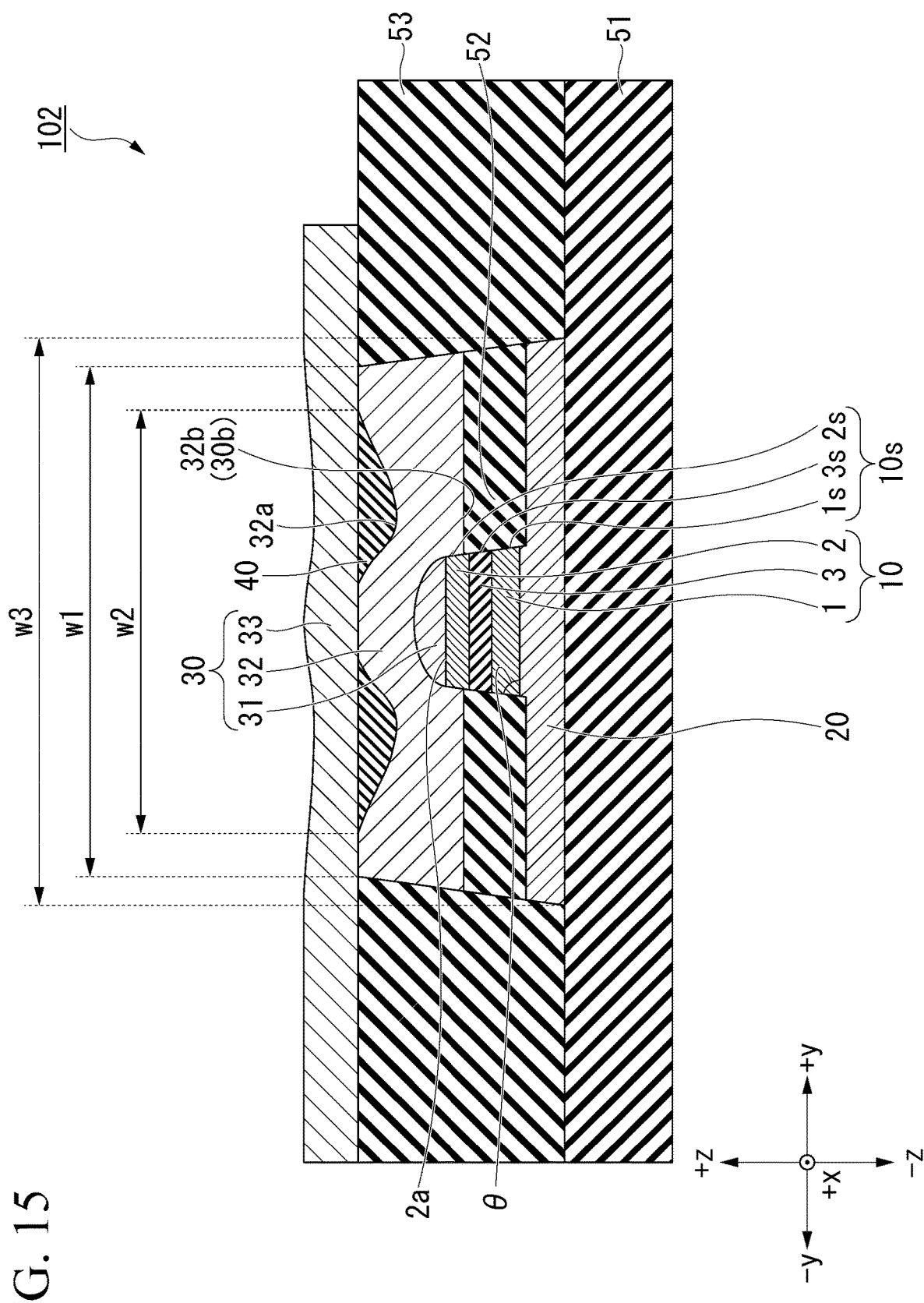
FIG. 15 is a cross-sectional view of the storage element according to the second modified example.

FIG. 14 is a plan view of a storage element 102 according to a second modified example. FIG. 15 is a cross-sectional view of the storage element 102 according to the second modified example. FIG. 15 is a cross section along a yz plane passing through the center of the width of the first wiring 20 in the x direction (a plane along line B-B in FIG. 14). The storage element 102 according to the second modified example is different from the storage element 100 in that the width w2 of the concave portion 32a1 and the compound portion 40 in the y direction is narrower than each of the width w1 of the second section 32 and the width w3 of the first wiring 20. Other constituent elements are the same as those of the storage element 100, the same reference signs are given to the same constituent elements, and the description thereof will be omitted.

When the width w1 of the second section 32 is wider than the width w2 of the concave portion 32a1 or the compound portion 40, the number of connection parts between the second section 32 and the third section 33 is three also in the y direction. When the number of connection parts between the third section 33 and the second section 32 increases, it is possible to suppress the local concentration of the read current. Further, by securing a plurality of paths for the read current, it is possible to prevent the read current from not flowing even if any one of the connection parts is peeled off due to distortion or the like.

Third Modified Example

Figure 16:
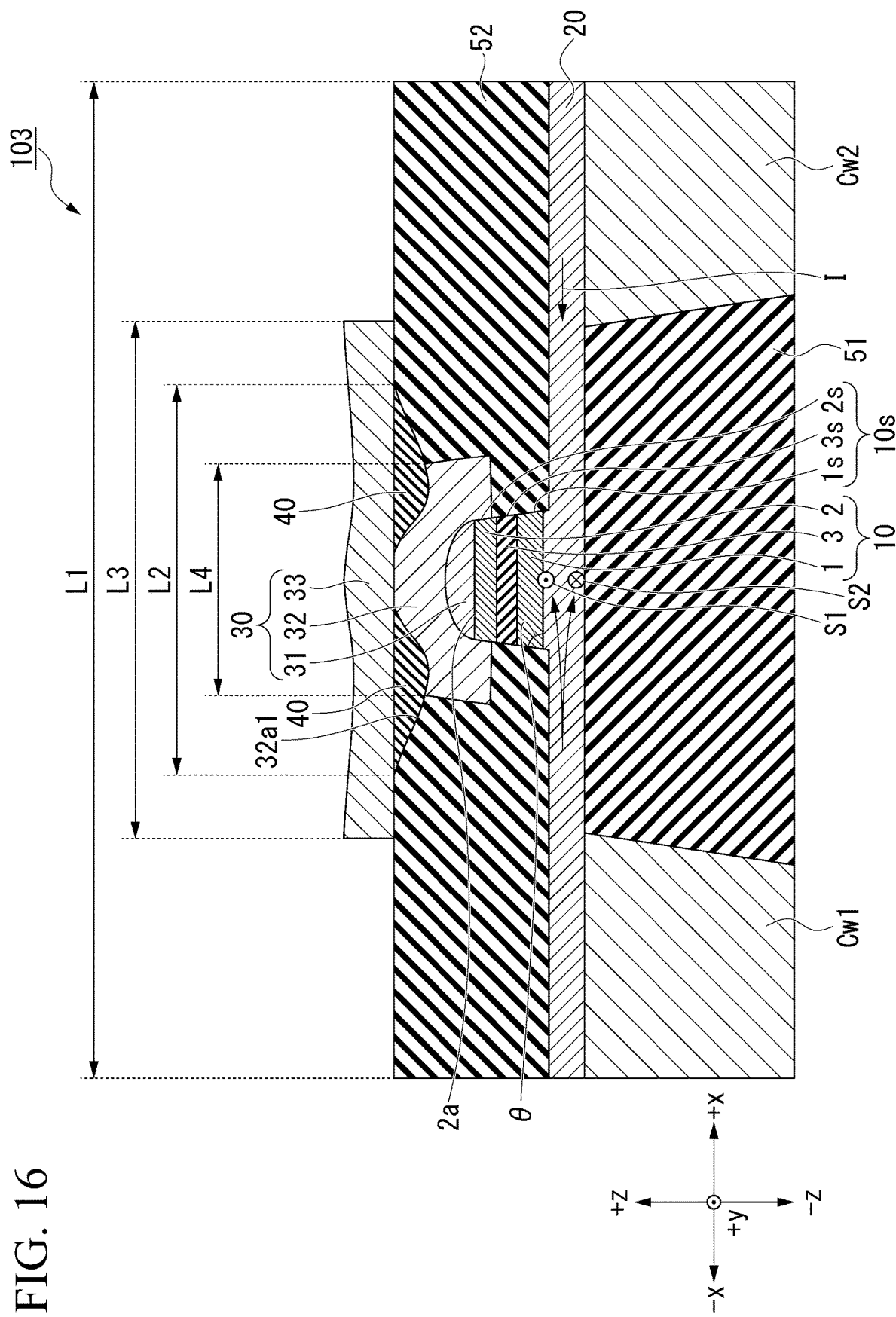
FIG. 16 is a cross-sectional view of a storage element according to a third modified example.

FIG. 16 is a cross-sectional view of a storage element 103 according to a third modified example. FIG. 16 is a cross section along a yz plane passing through the center of the width of the first wiring 20 in the x direction. In the storage element 103 according to the third modified example, the length of the second section 32 in the x direction is different from that in the storage element 100. Other constituent elements are the same as those of the storage element 100, the same reference signs are given to the same constituent elements, and the description thereof will be omitted.

The length L4 of the second section 32 in the x direction is different from the length L1 of the first wiring 20 in the x direction. Further, the length L4 of the second section 32 in the x direction is shorter than the length L3 of the third section 33 in the x direction.

Also in the storage element 103 according to the third modified example, the second section 32 is in contact with the lateral side surface 2s of the second ferromagnetic layer 2. Therefore, it is possible to efficiently pass the read current from the second section 32 to the magnetoresistance effect element 10 and to suppress the power consumption of the storage element 103.

Further, when the second section 32 having a lower resistance than the first section 31 is in contact with the lateral side surface 2s of the second ferromagnetic layer 2, the MR ratio of the magnetoresistance effect element 10 can be improved, and the reliability of the data of the storage element 103 can be improved.

Fourth Modified Example

Figure 17:
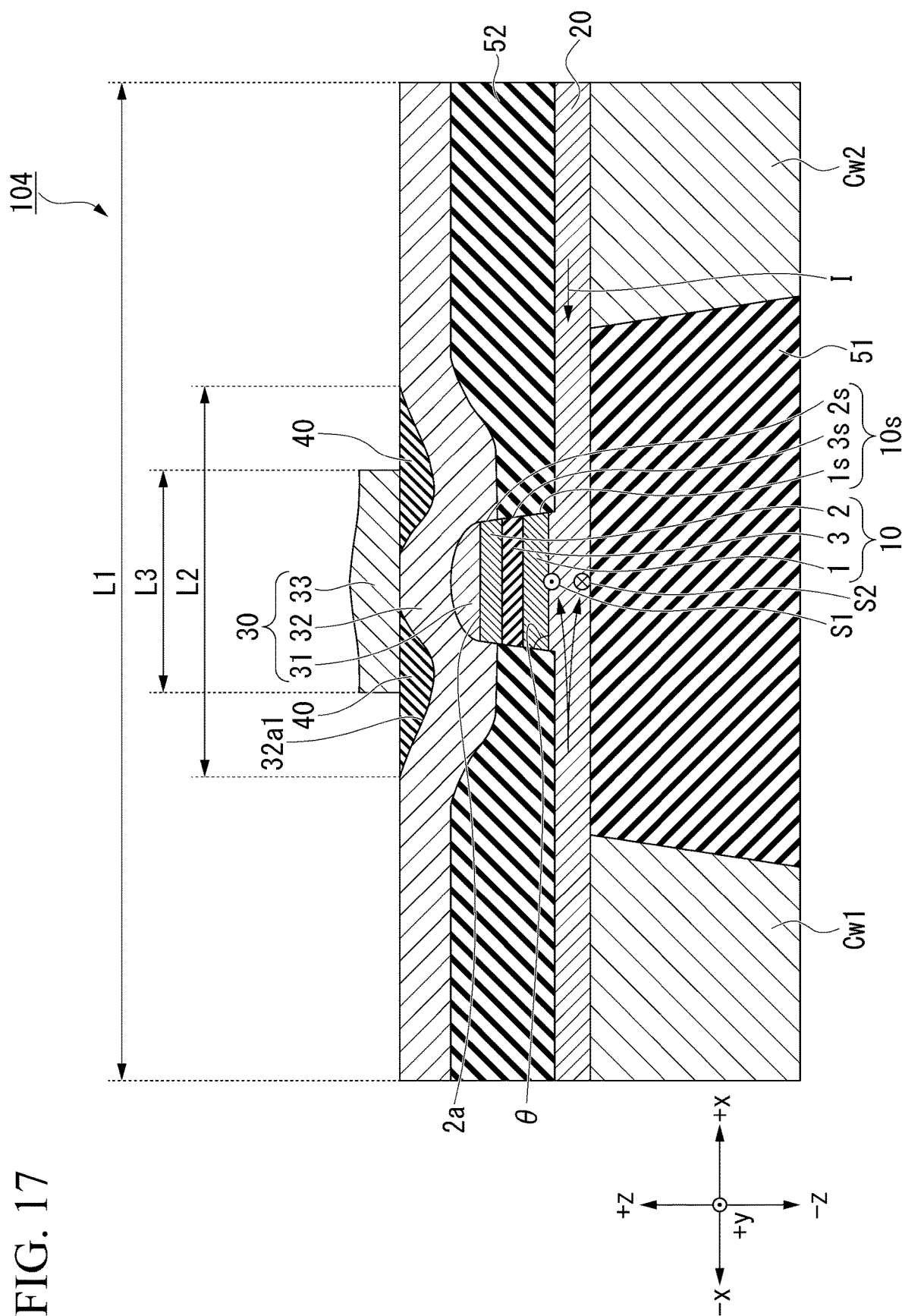
FIG. 17 is a cross-sectional view of a storage element according to a fourth modified example.

FIG. 17 is a cross-sectional view of a storage element 104 according to a fourth modified example. FIG. 17 is a cross section along a yz plane passing through the center of the width of the first wiring 20 in the x direction. In the storage element 104 according to the fourth modified example, the length of the third section 33 in the x direction is different from that in the storage element 100. Other constituent elements are the same as those of the storage element 100, the same reference signs are given to the same constituent elements, and the description thereof will be omitted.

The length L3 of the third section 33 in the x direction is shorter than the distance L2 between the outermost portions of the concave portion 32a1 in the x direction. The second section 32 and the third section 33 are connected to each other in one part.

Also in the storage element 104 according to the fourth modified example, the second section 32 is in contact with the lateral side surface 2s of the second ferromagnetic layer 2. Therefore, it is possible to efficiently pass the read current from the second section 32 to the magnetoresistance effect element 10 and to suppress the power consumption of the storage element 103.

Further, when the second section 32 having a lower resistance than the first section 31 is in contact with the lateral side surface 2s of the second ferromagnetic layer 2, the MR ratio of the magnetoresistance effect element 10 can be improved, and the reliability of the data of the storage element 103 can be improved.

(Fifth modified example)

Figure 18:
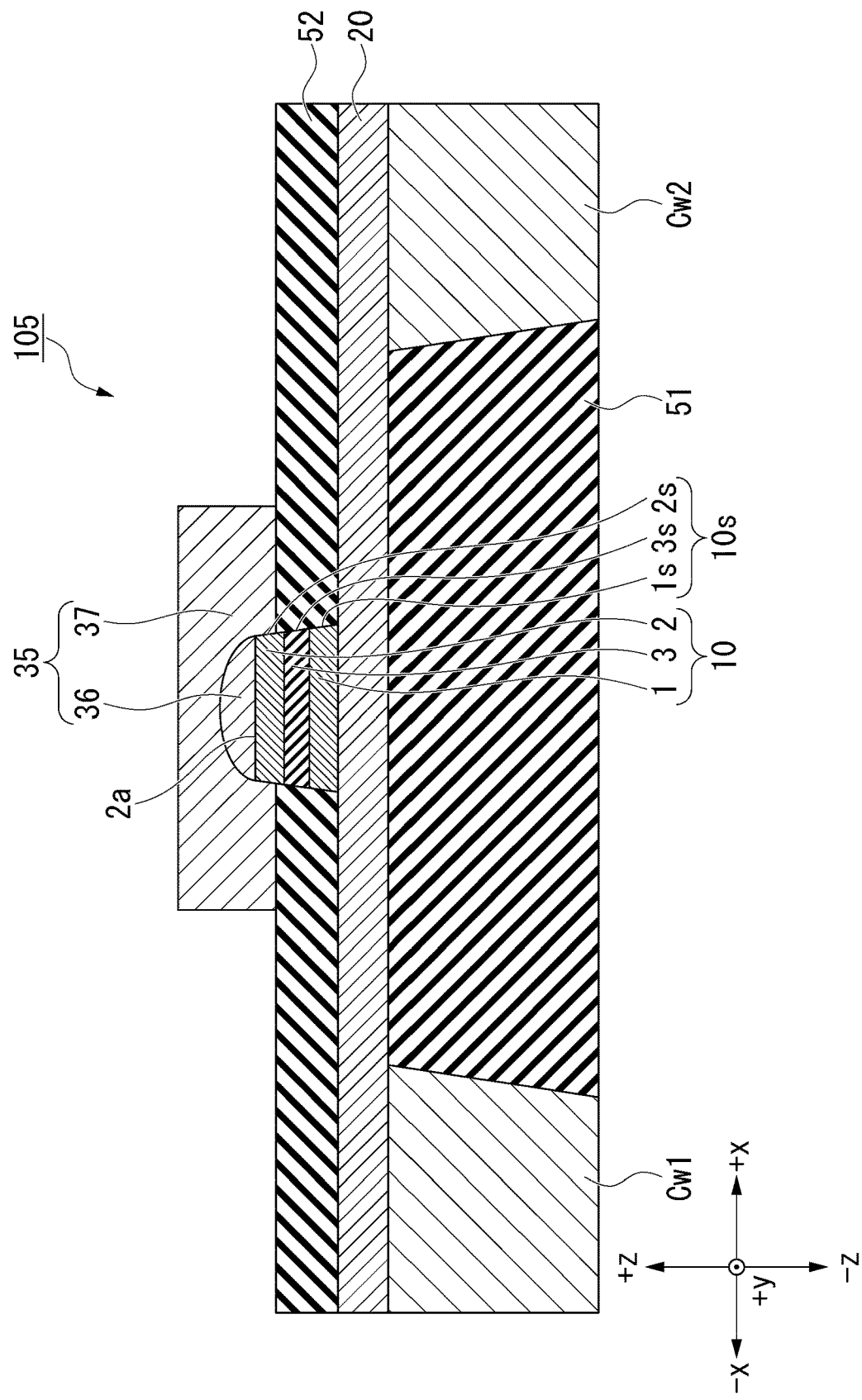
FIG. 18 is a cross-sectional view of a storage element according to a fifth modified example.

FIG. 18 is a cross-sectional view of a storage element 105 according to a fifth modified example. FIG. 18 is a cross section of the storage element 105 along an xz plane passing through the center of the width of the first wiring 20 in the y direction. In the storage element 105 according to the fifth modified example, the configuration of the electrode 35 is different from that in the storage element 100. Other constituent elements are the same as those of the storage element 100, the same reference signs are given to the same constituent elements, and the description thereof will be omitted.

The electrode 35 has a first section 36 and a second section 37. The first section 36 is located at a position overlapping the second ferromagnetic layer 2 in the z direction and covers the first surface 2a of the second ferromagnetic layer 2. The second section 37 covers the first section 31 and is in contact with the lateral side surface 2s of the second ferromagnetic layer 2. The second section 37 has a lower resistance than the first section 36, for example.

Also in the storage element 105 according to the fifth modified example, the electrode 35 is in contact with the lateral side surface 2s of the second ferromagnetic layer 2. Therefore, it is possible to efficiently pass the read current from the electrode 35 to the magnetoresistance effect element 10 and to suppress the power consumption of the storage element 105.

Further, when the second section 37 having a lower resistance than the first section 36 is in contact with the lateral side surface 2s of the second ferromagnetic layer 2, the MR ratio of the magnetoresistance effect element 10 can be improved, and the reliability of the data of the storage element 105 can be improved.

In the above, the present invention is not limited to the above-described embodiment and modified examples, and various modifications and changes can be made within the scope of the gist of the present invention described in the claims.

REFERENCE SIGNS LIST

1 First ferromagnetic layer
2 Second ferromagnetic layer
3 Nonmagnetic layer
10 Magnetoresistance effect element
1s, 2s, 3s, 10s Lateral side surface
20 First wiring 30, 35 Electrode
31, 36 First section
32, 37 Second section
32a1 Recess
32b1 Inclined surface
33 Third section
40 Compound portion
50, 51, 52, 53 Insulating layer
90 Conductive layer
91, 92 Magnetic layer
93 Nonmagnetic layer
100, 101, 102, 103, 104, 105 Storage element
110 First switching element
120 Second switching element
130 Third switching element
200 Semiconductor device
300 Magnetic recording array
e1 First end
e2 Second end
c1 Midpoint
CP Intersection
Cw1 First conductive portion
Cwt Second conductive portion

The invention claimed is:

1. A storage element comprising:
a first ferromagnetic layer;
a second ferromagnetic layer;
a nonmagnetic layer interposed between the first ferromagnetic layer and the second ferromagnetic layer in a first direction;
a first wiring that extends in a second direction different from the first direction and together with the nonmagnetic layer sandwiches the first ferromagnetic layer in the first direction; and
an electrode that together with the nonmagnetic layer sandwiches the second ferromagnetic layer in at least a part in the first direction,
wherein the electrode is in contact with at least a part of a lateral side surface of the second ferromagnetic layer,
the electrode has a first section covering a first surface of the second ferromagnetic layer opposite to the nonmagnetic layer and the second section covering the first section and extending in a second direction,
the second section is in contact with at least the part of the lateral side surface of the second ferromagnetic layer, and
the second section has a lower resistance than the first section.

2. The storage element according to claim 1, wherein the electrode has a third section in contact with the second section, and
a compound layer is provided between the second section and the third section.

3. The storage element according to claim 1, wherein a portion where a distance between the first wiring and the electrode in the first direction varies is provided.

4. The storage element according to claim 1, further comprising:
a first conductive portion and a second conductive portion which are connected to the first wiring at positions where the first ferromagnetic layer is interposed therebetween in the second direction,
wherein a first distance between the first wiring and the electrode at a midpoint between a first end of the first ferromagnetic layer on a side of the first conductive portion and a second end of the first conductive portion on a side of the first ferromagnetic layer in the second direction is shorter than a second distance between the first wiring and the electrode at a position further away from the first ferromagnetic layer than the midpoint.

5. The storage element according to claim 1, further comprising:
a first conductive portion and a second conductive portion which are connected to the first wiring at positions where the first ferromagnetic layer is interposed therebetween in the second direction,
wherein a first distance between the first wiring and the electrode at a midpoint between a first end of the first ferromagnetic layer on a side of the first conductive portion and a second end of the first conductive portion on a side of the first ferromagnetic layer in the second direction is shorter than a third distance between the first wiring and the electrode at an intersection between the electrode and the second ferromagnetic layer or the nonmagnetic layer.

6. The storage element according to claim 1, wherein a surface of the electrode on a side of the first wiring has an inclined surface that is inclined with respect to a first plane orthogonal to the first direction, and
an inclination of a tangent plane at a first point of the inclined surface with respect to the first plane is larger than an inclination of a tangent plane at a second point located on the second ferromagnetic layer side from the first point with respect to the first plane.

7. The storage element according to claim 1, wherein the first wiring contains any one of a metal, an alloy, an intermetallic compound, a metal boride, a metal carbide, a metal silicide, and a metal phosphide which generates a spin current due to a spin Hall effect when a current flows.

8. A semiconductor device comprising:
the storage element according to claim 1; and
a plurality of switching elements electrically connected to the storage element.

9. A magnetic recording array having a plurality of the storage elements according to claim 1.

10. A method of manufacturing a storage element, comprising:
a step of stacking a conductive layer, a first magnetic layer, a nonmagnetic layer, and a second magnetic layer in this order;
a step of processing the first magnetic layer, the nonmagnetic layer, and the second magnetic layer into a predetermined shape to form a magnetoresistance effect element in which a first ferromagnetic layer, a nonmagnetic layer, and a second ferromagnetic layer are stacked in this order;
a step of coating a periphery of the magnetoresistance effect element with an insulating layer such that a lateral side surface of the second ferromagnetic layer is exposed; and
a step of forming an electrode on one surface of each of the magnetoresistance effect element and the insulating layer.

* * * * *